United States Patent [19]

Mims

[11] 3,979,582

[45] Sept. 7, 1976

[54] DISCRETE ANALOG PROCESSING SYSTEM INCLUDING A MATRIX OF MEMORY ELEMENTS

[75] Inventor: James H. Mims, Linthicum Heights, Md.

[73] Assignee: Westinghouse Electric Corporation, Pittsburgh, Pa.

[22] Filed: Sept. 17, 1974

[21] Appl. No.: 506,906

[52] U.S. Cl. .......................... 235/193; 307/221 D; 328/167; 333/70 T
[51] Int. Cl.² .................. G11C 11/40; H03K 5/159
[58] Field of Search ....................... 235/193; 325/42; 340/173 R, 166; 307/238, 221 C, 221 D; 357/24, 45; 333/18, 28, 70 T; 328/167

[56] References Cited
UNITED STATES PATENTS

| | | | |
|---|---|---|---|
| 3,518,547 | 6/1970 | Filipowsky | 325/42 |
| 3,641,512 | 2/1972 | Bentchkowsky | 340/173 R |
| 3,763,480 | 10/1973 | Weimer | 340/173 R |
| 3,809,923 | 5/1974 | Esser | 307/221 D |
| 3,824,564 | 7/1974 | Wegener | 340/173 R |

Primary Examiner—Joseph F. Ruggiero
Attorney, Agent, or Firm—D. Schron

[57] ABSTRACT

A programmable analog transversal filter is disclosed for processing analog signals and comprising a charge-coupled device (CCD) for receiving a series of discrete analog signals to be delayed by increasing periods and applied to the outputs of the CCD, and a plurality of MNOS memory devices coupled to the taps of the CCD and being programmed so that the output of a CCD tap is multiplied by a particlar factor. In particular, the MNOS memory devices are disposed in a matrix of rows and columns. The outputs of the MNOS memory devices of each row are summed and the row output signal e(t—

$$e_o(t) = \sum_{k=1}^{n} W_k \cdot e(t-kT),$$

where $W_k$ is the weighting factor associated with the $K^{th}$ MNOS memory device are applied to corresponding inputs of a parallel-to-series converter taking the form of a CCD. The parallel-to-series converter then is enabled to serially read out the row outputs. The weighting factors are set into the system by varying the threshold voltage of the corresponding MNOS device. Positive and negative weighting factors are implemented by using first and second MNOS memory elements for each tap of the CCD, whereby depending upon the program incorporated into the system, one of the first and second MNOS memory devices is programmed to give a positive weighting factor and the other memory device a negative weighting factor. Further, a reiterative method of setting the weights into the MNOS device is used to compare the system output indicative of the weighting factor as set into one of the MNOS memory devices with the desired weighting factor as stored in a suitable storage memory such as a ROM, whereby a correction signal is developed to adjust the threshold voltage $V_{Th}$ of the one MNOS memory device in accordance with the stored weighting factor. In one illustrative embodiment, the weighting factors are set in accordance with sinusoidal signals, whereby the system performs a filtering function to provide an output upon receipt of an input signal of desired frequency. In addition, the MNOS devices are reprogrammable, thus permitting a single such system to be used in many different applications. In this regard, this system is particularly adapted for complex signal processing including filtering, generating desired functions, synthetic aperture radar signal processing and target identification processing.

24 Claims, 53 Drawing Figures

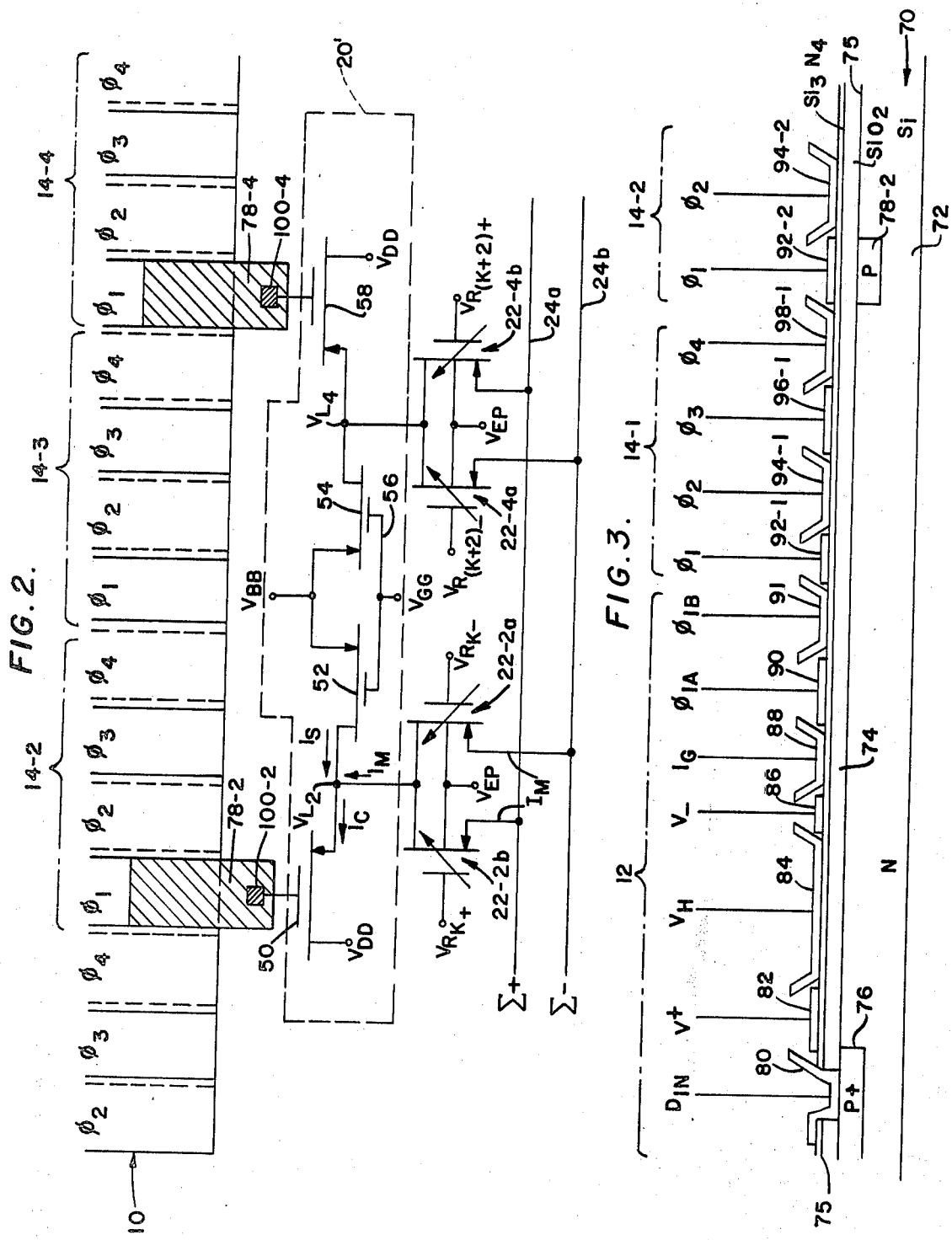

IN FIGS. 5A-5K, HIGH LEVEL REPELS AND LOW LEVEL ATTRACTS CCD CHARGE
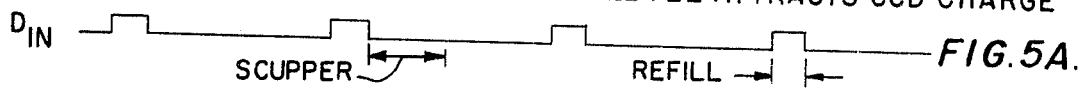
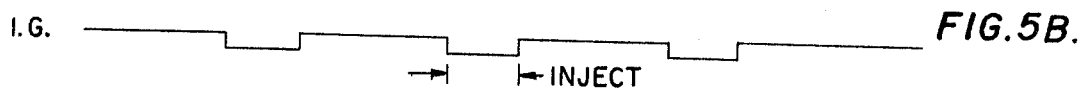
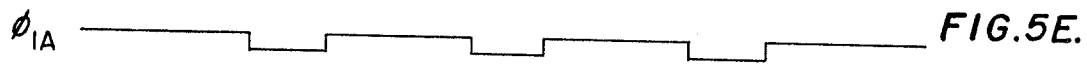
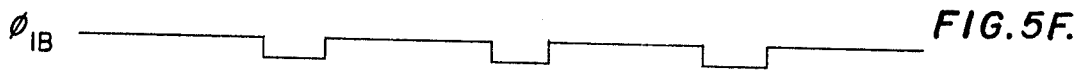
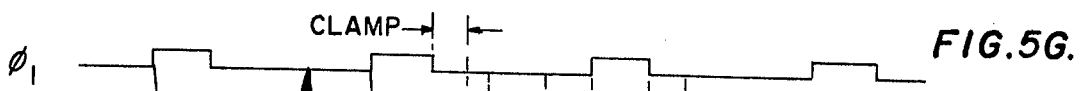
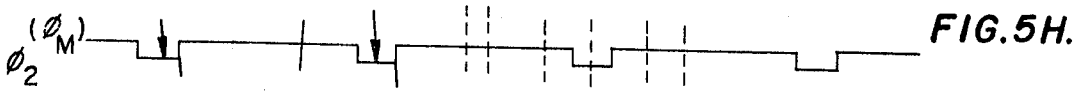
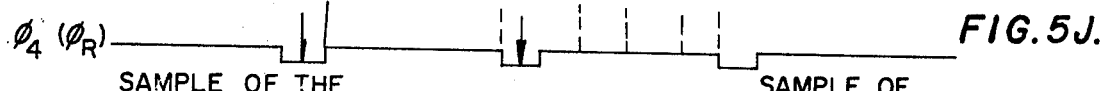
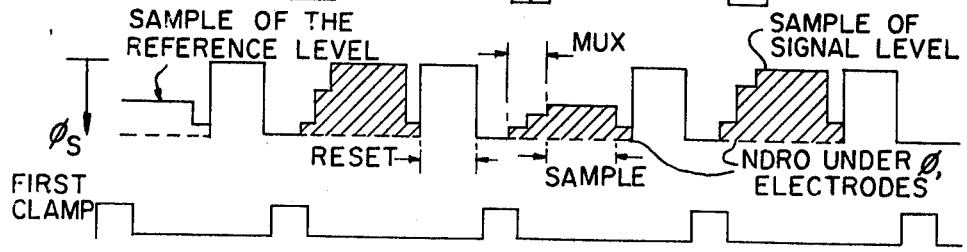
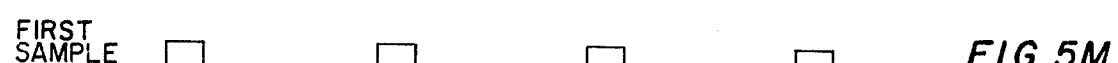
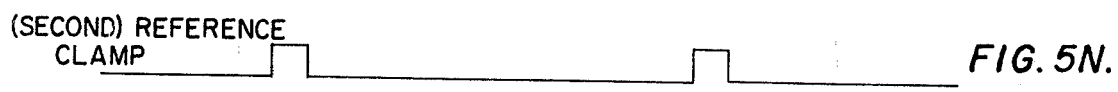
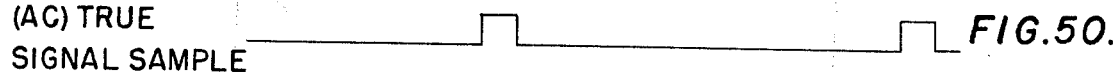
SWITCHING WAVEFORMS OF FIGS. 5L-5O:
HIGH → SWITCH CLOSED
LOW → SWITCH OPEN

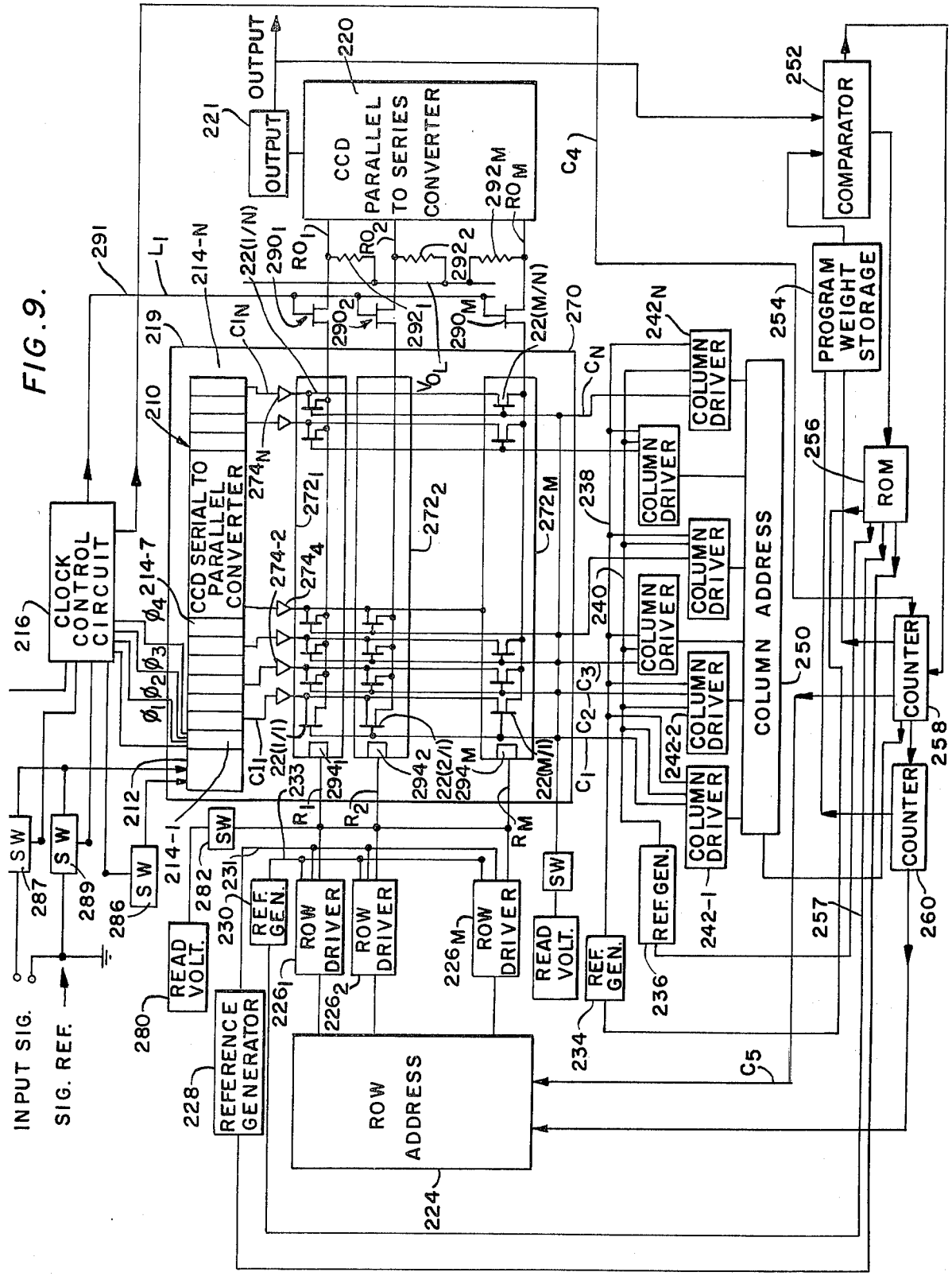

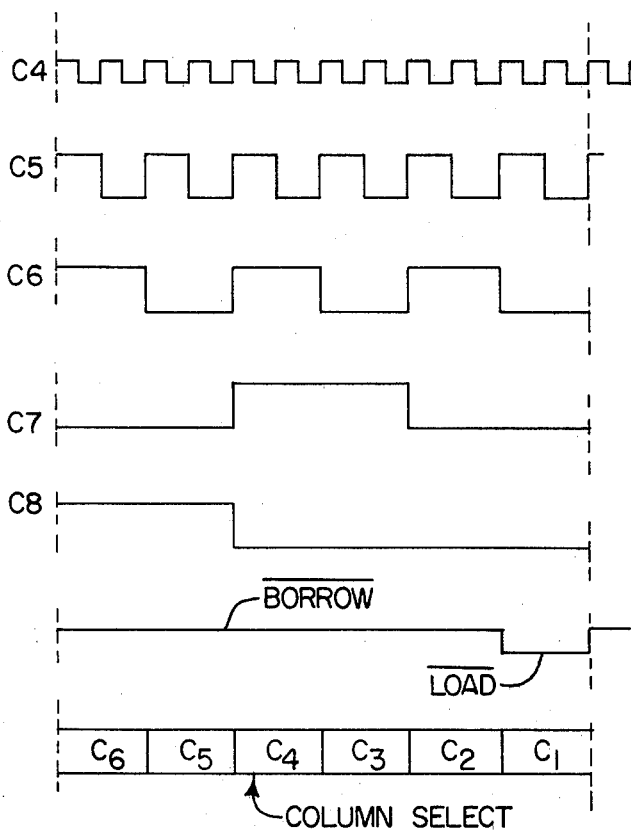
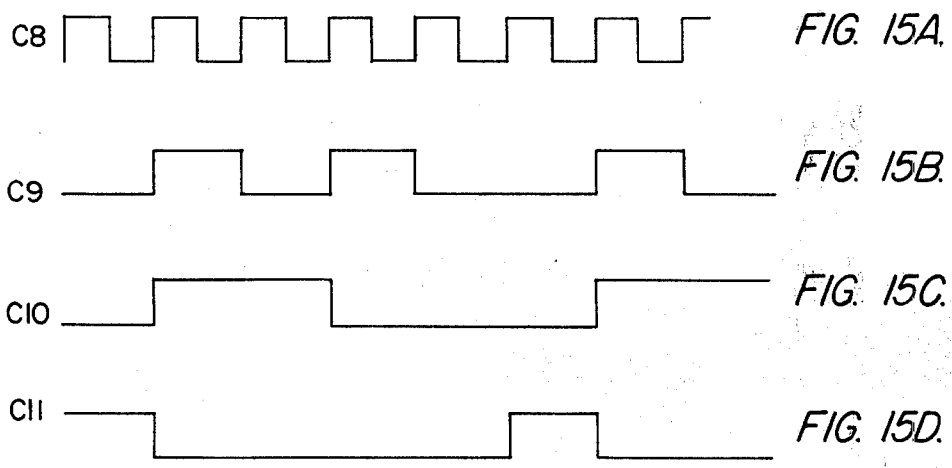

DISCRETE ANALOG PROCESSING SYSTEM INCLUDING A MATRIX OF MEMORY ELEMENTS

CROSS-REFERENCE TO RELATED APPLICATIONS

Reference is made to the following related patent applications, each of which is assigned to the present assignee and specifically incorporated herein by reference:

Ser. No. 437,650, "The Structure of and the Method of Processing a Semiconductor Matrix of MNOS Elements", filed Jan. 29, 1974 in the names of James R. Cricchi and Barry W. Reuhling;

Ser. No. 437,649, entitled "Block-Oriented Random Access Memory", filed Jan. 29, 1974 in the names of J. R. Cricchi and Franklyn C. Blaha; and Ser. No. 507,115, entitled "A Programmable Analog Transversal Filter", filed concurrently herewith in the names of Donald R. Lampe, Marvin H. White and James H. Mims.

BACKGROUND OF THE INVENTION

1. Field of the Invention

This invention relates generally to discrete analog signal processing and more particularly to such systems as comprised of charge transfer devices (CTD's) for sampling and providing discrete delays to an input signal and an array of MNOS memory devices capable of being programmed to multiply the outputs of the CTD device in accordance with a defined function. Such CTD and MNOS devices are particularly adapted to be implemented by large-scale integration (LSI) techniques.

2. Description of the Prior Art

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or bits, each of which may be operated upon one-at-a-time and have an amplitude containing information or data corresponding to M digital bits, where one analog bit equals M digital bits. Thus, the number of operations performed in DASP is significantly reduced, thereby requiring a corresponding less number of elements to carry out the desired processing.

In DASP, the input analog signal is sampled at a predetermined, constant or frequency $f_c$, which samples are stored, transferred and operated upon by analog means. In DSP, digital or quantized samples are handled with binary logic. In a similar manner, it has been suggested that charge coupled devices (CCD's) are uniquely capable of effecting DASP in that they are uniquely capable of sampling and non-destructively storing at each of their outputs the delayed signals to be processed in an analog fashion. Such DASP systems incorporating CTD's, retain the capability of precise transport delays, of particular interest in coherent processing. The dynamic range where one bit of resolution in DSP is equivalent to 6dB dynamic range in the analog signal. Experiments have shown that a signal charge analog packet can be shifted through a typical CCD nearly unattenuated, limited by the size of the holding wells and the minimum detectable output signal.

As more fully described in an article entitled, "Charge Coupled Semiconductor Devices" appearing in *Bell System Technical Journal*, April 1970, by W. S. Boyle and G. E. Smith, CCD's sample an analog input signal to provide a series of analog bits to be stored in potential wells created at the surface of a semiconductor and transported along the surface by timing or phase signals. More particularly, these charges constitute minority carriers stored at the silicon-silicon dioxide interface of MNOS non-memory capacitors and are transferred from capacitor or well to capacitor or well on the same substrate by manipulating the voltages applied across the capacitor.

As described in the articles entitled, "Transversal Filtering Using Charge Coupled Devices" by D. D. Buss, D. R. Collins, W. H. Bailey and C. R. Reeves, published in IEEE Journal of Solid State Circuits, SC-8, pp. 138–46, April, 1974, and "A Surface Charged Correlator For Signal Processing" by J. J. Tiemann, R. D. Baertsch and W. E. Engeler, as presented at the CCD Applications Conference, September 1973, CCD's may be adapted for analog signal processing and in particular, for use as transversal filters wherein the CCD's effect a serial transfer of charge packets along a linear path. At each stage, the amount of charge may be nondestructively measured at its corresponding tap. To form a transversal filter, the tap outputs are approximately weighed and summed. As suggested in the noted article, a tap weight may be provided by dividing each stage of the CCD into two portions and sensing only charge on one of them through the capacitor electrode. Summation of the charge residing on all the selected taps is performed by connecting all of the capacitor electrodes to a common drive circuit and monitoring the drive current required to charge or to discharge them. Thus, the multiplicative tap weights are determined by the location of cuts in the capacitor electrode plates and the addition is performed by strapping the capacitor electrodes together. However, the weights provided by the described electrode configuration are fixed and there is no suggestion as to how tap error may be compensated. Further, the analog signals are mixed with clock currents and the dynamic range of such a system is restricted.

A cross-correlator performs similar functions as a transversal filter, differing in that the tap weights are set in accordance with a second input signal. Thus, a cross-correlator can implement all of the possible transversal filter functions and may be considered as a truly general-purpose signal processing device. However, a cross-correlator requires that the tap weights be programmable in accordance with an input signal. The above-described method for achieving tap weights by cutting the capacitor plate results in a fixed weighting unsuitable for cross-correlator devices. Thus, the noted article by Tiemann et al. concludes that "there is no convenient way of obtaining an electrically variable multiplicative fraction of the surface charge in the storage reservoir", thus eliminating use of the described system for such purpose.

Further, there has been suggested that the use of MNOS transistors of different conductances to provide the desired weighting at the non-destructive taps of the CCD device. Although this approach avoids the mixing of analog and digital transients, the weights provided by the transistors are still fixed, thus limiting the flexibility of the resulting system and in particular making it unsuitable for use as a cross-correlator as noted above.

SUMMARY OF THE INVENTION

It is therefore an object of this invention to provide a flexible system for effecting discrete analog signal processing (DASP).

It is a more particular object of this invention to use a programmable MNOS device as a weighting device to be coupled to the taps of a charge transfer device, whereby complex DASP may be effected.

In accordance with these and other objects of this invention, there is provided a discrete analog signal processing system comprising a sampling and storing means in the form of a charge transfer device (CTD), for providing at its plurality of outputs or taps the sampled signal, and a plurality of programmable weighting elements in the form of MNOS devices coupled to the CTD's taps, whereby the outputs of the CTD may be variably weighted in accordance with a desired program. Such a system permits the implementation of complex DASP and in particular the implementation of Fourier transformers, matched filters, correlators and adaptive-type filters.

In one illustrative embodiment of this invention, the weighting or memory elements are disposed in a matrix of rows and columns, with each row programmed in accordance with a predetermined waveform. In its operation of processing analog input signals, the plurality of outputs are derived from each stage of the sampling and storing means and applied to the columns of the matrix. In turn, outputs are derived from each of the memory elements indicative of the product of the sampling and storing means output applied to the MNOS device and its weighting factor, and applied to the row conductor associated with that memory device. The memory element outputs applied to a row are summed and applied to a parallel-to-series converter illustratively taking the form of a CCD. In turn, the parallel-to-series converter is enabled to read out in a serial fashion the row outputs to provide an overall system output.

In one aspect of this invention, negative and positive (as well as real and imaginary) coefficients or weights may be applied to the outputs of the sample and store means by incorporating first and second MNOS devices to be programmed respectively in accordance with the positive and negative weighting factors. In addition, the outputs of each of the first and second MNOS devices are connected respectively to a summing bus, whereby the outputs of each of the sets of negative and positive weighting factors may be summed together. In this regard, the MNOS devices are programmed in accordance with a set of weighting factors whereby only the difference between conductances of the first and second weighting devices associated with an output of the CTD device is programmed to give the desired negative or positive weighting factor.

In a further aspect of this invention, a set of weighting factors is stored in a suitable memory to be read out and applied in sequence to the corresponding MNOS weighting devices. A test signal is applied to the CTD and stepped along its corresponding stages, whereby an output signal is developed sequentially at the output taps of the CTD device. The output is multiplied by each of the MNOS weighting devices and their outputs are applied to a comparator for comparing the output from each of the weighting devices with the weighting factor as stored in the memory. If a difference is detected, the comparator generates an error signal, whereby the weighting factor as set into the corresponding MNOS device is readjusted to the desired value.

In a still further aspect of this invention, the weighting factor is set into each of the MNOS devices by adjusting its threshold voltage. In one illustrative method, a single pulse is applied to the gate of the MNOS weighting device to increase or decrease its threshold voltage in accordance with the desired weighting factor. Alternatively, an adjustment to the weighting factor, either to increase or decrease, is made by generating a burst of bipolar signals, the sum of which is negative or positive for effecting, respectively, an increase or decrease in the threshold voltage of the MNOS device and therefore its weighting factor.

BRIEF DESCRIPTION OF THE DRAWINGS

These and other objects and advantages of the present invention will become more apparent by referring to the following detailed description and accompanying drawings, in which:

FIG. 2 is a more detailed view of the interconnection of the MNOS devices between the outputs of the CCD and the summing buses;

FIG. 3 is a general, cross-sectional view of the CCD and the electrode connections thereto;

FIGS. 5A to 5K, and 5L to sO show, respectively, the signals appearing at the electrodes of the CCD device shown in FIG. 3, and the pulse control signals applied to the reconstruction circuit of FIG. 1;

FIG. 9 is a functional block diagram of an alternative embodiment of this invention, including a plurality of programmable MNOS devices disposed in a matrix of rows and columns and a parallel-to-series converter for deriving outputs from each row of the matrix to provide a serial output thereof;

FIGS. 13A to 13K show the waveforms of the control and clocking signals as developed by the clock control circuit of FIGS. 9 and 12;

FIGS. 14A to 14G show the waveforms of the signals as applied to and derived from the column counter of FIGS. 9 and 12; and FIGS. 15A to 15E show the waveforms of the signals as applied to and derived from the row counter of FIGS. 9 and 12.

BRIEF DESCRIPTION OF THE PREFERRED EMBODIMENTS

Figure 1A:
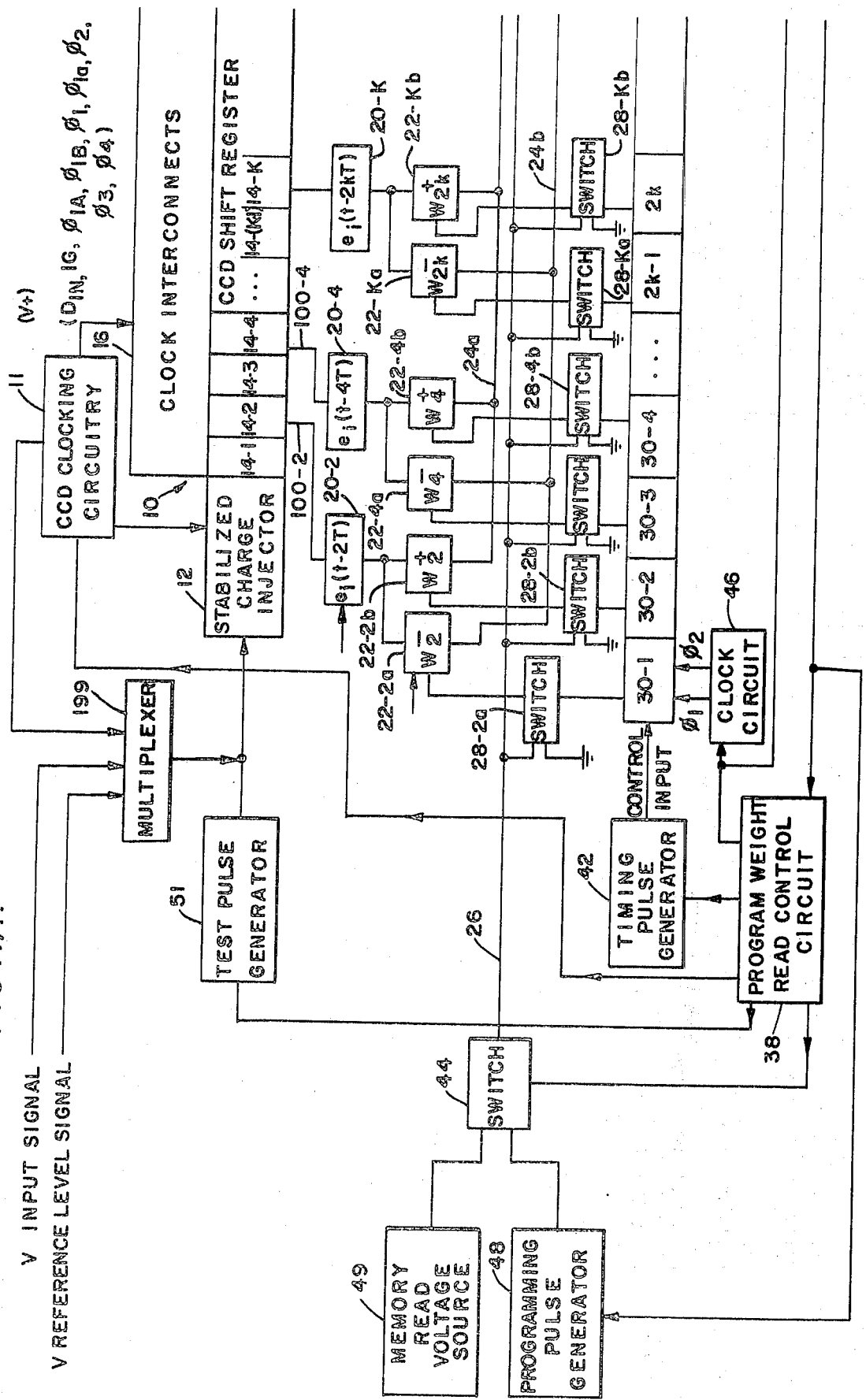
FIGS. 1A and B show a functional block diagram of a DASP system incorporating a CCD and a plurality of programmable MNOS devices, in accordance with teachings of this invention.

With regard to the drawings and in particular to FIG. 1, there is shown in diagrammatic form a discrete analog signal processing system in accordance with the teachings of this invention and comprising a charge transfer device illustratively taking the form of a charge coupled device 10 acting as means for sampling an input signal and for transporting the sampled signal linearly therealong to be non-destructively read out at a plurality of output electrodes 100-2 to 100-N generally referred to by the numeral 100. As generally shown in FIG. 1 and more specifically depicted in FIG. 3, the input signal is injected into the CCD 10 by a stabilized charge injection 12, while suitable clock signals from a CCD master clock circuit 11 are provided to clock interconnections 16 for the shifting of the sampled input signal in the form of charge packets, including at least four phase signals, $\phi_1$, $\phi_2$, $\phi_3$ and $\phi_4$, as shown specifically in FIGS. 5G 5J. The output as derived from the last stage is applied to a correlated double sampling output circuit 18. Circuit 18 is incorporated into the system of FIG. 1 for providing a test point for checking the operation of the CCD 10 and resembles the circuit as described in U.S. Pat. No. 3,781,574. Evenly-spaced outputs are taken by the output electrodes 100 from the CCD 10 as shown in FIG. 2 and applied through corresponding buffer circuits 20' to pair of programmable weighting factor devices indicated generally by the numeral 22 and having a suffix indicating its corresponding tap. As will be explained in detail later, one of the weighting factor devices associated with each output electrode 100 is interconnected to provide a positive (or real) weighting factor, while the other device 22 is interconnected to provide a negative (or imaginary) weighting factor. As shown in FIG. 2 the output of each of the weighting factor devices, illustratively taking the form of MNOS devices, is connected respectively to one of a positive or a negative summing bus 24a and 24b, to be summed by an analog reconstruction circuit 32.

As seen in FIG. 1, groups of the stages of the CCD 10 are designated by the numeral 14 with a suffix indicative of the stage's number. For example, the second group of stages of the CCD 10 is designated with the suffix "2", while the corresponding output terminal 100, and weighting elements 22 are designated with a corresponding suffix "2". In this regard, the negative weighting factor device is designated with the numeral "22-2a", whereas the positive weighting factor device is designated with the numeral "22-2b". The remaining output electrodes 100 and weighting factor devices 22 are similarly designated.

Basically, the DASP system of FIG. 1 operates to multiply the programmable threshold voltage of the MNOS devices 22 with a CCD output obtained by non-destructive sensing via a surface potential sensing diffusion beneath a selected well of the CCD 10. Alternatively, a floating clock sensor may be used to read the CCD outputs in parallel, as explained in the above-identified application entitled "A Programmable Analog Transversal Filter". The output of the MNOS device 22 needs to be directly proportional to the product of the CCD signal and the weighting factor set by the MNOS threshold voltage $V_{TH}$, and must be capable of being summed with many other similar outputs. To achieve this last-mentioned requirement, the outputs should come from current sources and can be summed in an operational amplifier as shown in FIG. 1.

In particular, as shown in FIG. 2, the output of the selected stage or well of the CCD 10 is applied to a constant current source taking the form of a MOS FET 50 or 58. The CCD 10 is driven by four phase signals, and the CCD output is sensed by a P+ diffusion region 78-2 disposed underneath the $\phi_1$ well of each group 14 to be tapped. As shown in FIGS. 2 and 3, the P+ diffusion region 78 is formed within a substrate 70 and in particular within a layer 72 of silicon, beneath an electrode 92-2 to which the $\phi_1$ transfer signal is applied. As shown in FIG. 2, the output electrode is connected to the P+ region 78-2, whereby the charge stored in the well underneath the electrode 92-2 is sensed non-destructively to apply an output signal to the MOS FET 50. A similar output is derived from the P+ region 78-4 disposed beneath the $\phi_1$ electrode of the group 14-4 to provide an output to the MOS FET 58. As shown in FIGS. 2 and 3, each group 14 of stages or wells is formed of four such wells beneath the corresponding electrodes 92, 94 96 98; as explained above, the aforementioned electrodes are designated with suffix numbers corresponding to that group of wells to which they belong. For example, the $\phi_1$ electrode of the first group is designated 92-1.

In order to realize DASP, the system must have the following characteristics:

1. a low-loss (approximately 1%), high dynamic range (greater than 60 dB), non-dispersive analog delay line with linearity (approximately 1%) in signal injection 2. a non-destructive, sensing tap with analog multiplier or weighting, with accuracy of approximately 1% and linearity of approximately 1% in signal extraction; and 3. a method to compensate for offsets caused by voltage drift and bias errors.

The analog delay line loss and dispersive characteristics of the CCD 10 as described herein are determined by the transfer efficiency e which has been measured to be less than $1(10^{-4})$ at a clocking frequency $f_c = 3$ MHz, for 6 micrometer transfer electrodes and 9 micrometer storage electrodes. As will be explained, the CCD 10 is a surface channel, four-phase, stepped-oxide with a 20% fat-zero in each CCD well. The input signal is injected as shown generally in FIG. 1 and more specifically in FIG. 3, and extracted as shown in FIG. 2 with approximately 1% linearity. As shown in FIGS. 2 and 3, the charges stored in the wells beneath the $\phi_1$ electrodes 92 are sensed through P-type diffusion regions 78 and voltage developed thereby is applied through the electrodes 100 to the buffer circuit 20' and particular to the gate electrodes of the MOS FETs 50 and 58. Further, a biasing voltage $V_{DD}$ is applied to the drain of each of the MOS FET's 50 and 58, while the source electrodes thereof are biased by a constant current generator formed respectively by the MOS FET's 52 and 54. The source follower arrangement as shown in FIG. 2 transforms the high impedance associated with the P-type sensing diffusion regions 78 into a low-impedance voltage node indicated generally by the designation $V_L$. Suitable biasing voltages $V_{GG}$ and $V_{BB}$ are applied, respectively, to the gate electrodes and to the source electrodes of the MOS FET's 52 and 54. The input signal may be injected and extracted (sensed) with approximately 1% linearity by the use of the MOS FET's 50 and 58 to be operated in their pentode region.

The non-destructive programmable weighting taps are achieved by the use of programmable MNOS memory transistors 22, which in general provide an output $e_0(t)$ indicated by the following equation:

$$e_o(t) = \sum_{k=1}^{N} W_k e_i(t-kT) \quad (1)$$

where $W_k$ is the weighting function associated with the $k^{th}$ tap position and $e_i$ is the voltage signal as derived from the non-destructive sensing and buffering circuit 20. In particular, the weighting factors are set in a plurality of programmable MNOS transistors 22, the outputs of which are summed upon the positive summing bus 24a or the negative bus 24b. As shown in FIG. 2, the output voltage $V_L$ as derived from the source of the MOS FET 50 indicative of that voltage sensed beneath the $\phi_1$ electrode of group 14-2, is applied to the drain of each of a first or positive weighting factor MNOS transistor 22-2b and a second or negative weighting MNOS transistor 22-2a; the transistors 22-2b and 22-2a are respectively connected to the positive and negative buses 24a and 24b. As will be explained, a variable weighting factor is programmed into one of the transistors 22-2a and 22-2b to provide the desired negative or positive weighting factor to be multiplied by the sampled and delayed signal derived from the electrode 100-2. In summary, the reprogrammable MNOS transistors 22, as operated in their linear triode region, connects the voltage node $V_L$ to one of the summing points or bars 24a or 24b, thereby providing an output signal current $I_M$ directly proportional to the product of the MNOS programmable weight and $V_L$, the CCD surface potential as transformed by a "unit gain" source follower as provided by the MOS FET's 50 and 58, in accordance with the following equation:

$$I_M = -g_{d_sM} \cdot V_L \text{ where } g_{d_sM} = \mu C_M (W/L) Q_M \cdot (V_R - V_{TH}) \quad (2)$$

where:

$V_R$ is the common memory gate voltage, $C_M$ is the capacitance of the memory multiplier transistor, $(W/L)_{QM}$ is the effective ratio of the width-to-length of the multiplier memory transistor, and $\mu$ is the minority carrier mobility of substrate 72.

The weighted output as applied to one of the summing bars 24a or 24b by the MNOS transistors 22 possess a linearity limited only by that of the MNOS transistors 22, when operated as a fixed conductance. Any geometric or other variances arising due to manufacturing processes are compensated via the tap weighting programming and calibrating procedure, as will be explained. In a similar manner, the voltage as developed at The node $V_{L4}$ coupled to the source of the MOS FET 58 is applied to the drain electrodes of the programmable MNOS transistors 22-4b and 22-4a to provide an output as applied to the positive and negative summing bars 24a and 24b according to the product of the weighting factor set into one of the transistors 22-4a or 22-4b *and the surface potential sensed at the diffusion region 78.* V The operation of the MNOS transistors 22 in its three modes, ERASE or CLEAR, WRITE or READ, will now be explained in detail with respect to FIG. 2. The ERASE mode is effected by applying to the substrate a negative voltage relative to the gate of the MNOS transistors 22, whereby the MNOS transistors 22 acting as a memory is disposed in its low threshold state. As shown in FIG. 2, a negative voltage $V_{EP}$ is applied to the substrate of the transistors 22, in the order of $-20V$, while applying a voltage $V_R$ of ' V to the gate, a voltage in the order of $-20V$ through the positive and negative bars 24a and 24b to the sources of the MNOS transistors 22, and a voltage in the order of $-20V$ to the drains of the MNOS transistors 22. As will be explained later, the voltage $V_L$ appearing at the drains of the transistors 22 is developed by applying a test voltage to the CCD 10 and advancing it from well to well, whereby a potential in the order of 5V to 15V is developed at the electrodes 100 and a corresponding voltage is developed at the node $V_L$ and the drains of the transistors 22. For the illustrative embodiment of this invention wherein the MNOS transistors 22 are formed with P-type drain and source regions and formed within an N-type silicon substrate 72 covered by a first layer 74 of silicon oxide and a second layer 75 thereover of silicon nitride, positive charges are established at the interface of the silicon oxide layer 74 and the silicon nitride layer 75. In order to ERASE (or CLEAR), the MNOS transistors 22 are set to their low threshold voltage state by, in effect, applying a positive voltage to the gate electrode thereof, whereby the positive interface charges are driven or tunneled through the silicon oxide layer 74 into the silicon substrate 72. The threshold voltage $V_{TH}$ when the MNOS transistor 22 has been cleared, is in the order of 2V.

In the WRITE mode, the programmed weighting constants, $W_k$ are set or written into the MNOS transistors 22 by raising their threshold voltage $V_{TH}$ to a value corresponding to the programmed weighting constant. In the WRITE mode, the voltage $V_{EP}$ coupled to the substrates of the MNOS transistors 22, and the voltages applied to the sources and drains thereof are placed at zero, while the voltage $V_R$ coupled to the gate electrodes of the MNOS transistors 22 is varied in accordance with the desired weighting factor $W_K$ between values of zero and $-20V$, whereby the threshold voltage $V_{TH}$ is selectively set between a low threshold value of 2V and a high threshold value of 12V.

After the DASP system as shown in FIG. 1 has been programmed with the desired weights $W_K$ set into each of the MNOS transistors 22, an input signal is applied to the CCD 10 to be sampled and shifted through each of the wells or stages thereof to provide outputs at the electrodes 100. As explained above, the CCD outputs are sensed through the P+ region 78 and applied to the MNOS transistors 22; the output of transistors 22 are indicative of the product of the sampled and delayed input signal and the weighting factor $W_K$. During the normal operation of the DASP system as shown in FIG. 1, the MNOs transistors 22 are operated in their READ mode, wherein the voltage $V_R$ as applied to the gate electrodes of the MNOS transistors 22, is set in the range of −6V and −12V relative to substrate 70, and the voltage $V_L$ as applied to the drain of the MNOS transistors 22 is the delayed and sampled output of the CCD 10 according to the input signal applied to the stabilized charge injector 12. In the READ mode, the substrate voltage $V_{EP}$ is set at 0V. The output signal derived from the MNOS transistors 22 are applied as shown in FIGS. 1 and 2 to the positive and negative summing bars 24a and 24b to be summed together by an analog reconstruction circuit 32 (see FIG. 1), as will be explained.

As more fully discussed in an article entitled "An Electrically Programmable LSI Transversal Filter For Discrete Analog Signal Processing (DASP)", appearing in Proceedings of CCD Applications Conference, San Diego, 18–20, September 1973 pp. 111–26, James H. Mins et at., the conductance of the MNOS transistors 22 in terms of their memory current versus drain-to-source voltage is dependent upon the length and number of pulses applied to the gate electrode during the WRITE or programming mode of operation of the MNOS transistors 22. Thus, in one embodiment of this invention, it is contemplated that single pulses of selected amplitude in the order of 15V to 25V and of selected duration in the range of $1\mu$ sec to $10\mu$ sec are applied to the gate electrodes of the MNOS transistors 22 to effect the desired shift in the threshold voltage $V_{TH}$. A pulse of a duration of $10\mu$ sec and an amplitude of −20V will shift the threshold voltage of the MNOS transistor 22 from its low threshold voltage $V_{TH}$ in the order of −1.5V to a high threshold voltage $V_{TH}$ in the order of −8.8V.

Figure 8A:
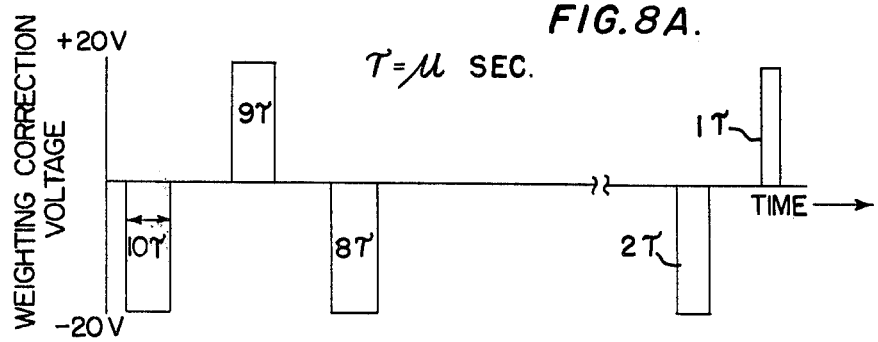
FIGS. 8A and 8B show bursts of weight corrective voltage signals for effecting an increase and decrease, respectively, in the threshold voltages of the MNOS devices of FIG. 1.
Figure 8B:
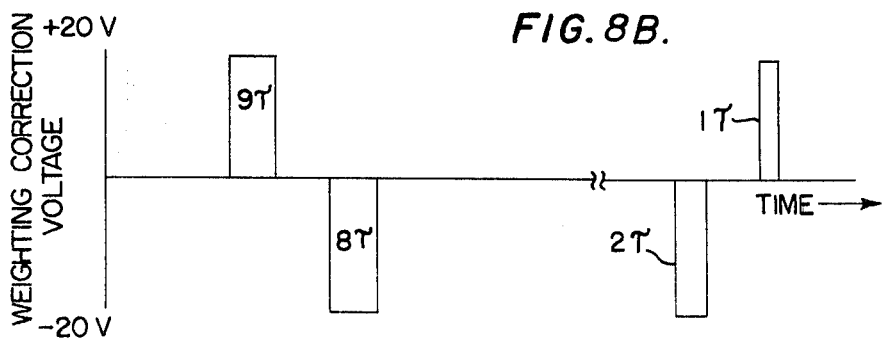

In an alternative mode of operating the MNOS transistors 22, a bipolar pulse train of selected height and variable duty ratio is applied to the gate electrodes of the MNOS transistors 22 to effect the desired shift, i.e., to either increase or decrease the threshold voltage $V_{TH}$ of the MNOS transistor 22. As shown in FIG. 8A, a variable duty train of pulses beginning with a negative-going pulse of a duration of $10\tau$ and terminating with a positive-going pulse of $1\tau$, where $\tau$ is in the order of $1\mu$ sec and the pulse amplitude is approximately 15V to 20V, is applied to the MNOS transistor gates to effect an increase of the threshold voltage. The sum of the variable duty pulse train as shown in FIG. 8A is negative, thus increasing the number of charges at the silicon oxide/silicon nitride interface of the MNOS transistor 22, and thereby increasing its threshold voltage $V_{TH}$. By contrast, FIG. 8B shows a variable duty train of pulses beginning with a positive-going pulse of $9\tau$ width and terminating with a positive-going pulse of $1\tau$ width; as a result, the sum of the bipolar signals is positive, thereby tending to tunnel the positive interface charges into the silicon substrate so that the MNOS transistor threshold voltage $V_{TH}$ is reduced. As discussed in the above-noted article, measurements have been made upon MNOS transistors to test their memory characteristics and to demonstrate that after an initial period of 20 minutes and even after 100,000 minutes of storage, the conductance drift is relatively small. Significantly, the drift deviation was improved by writing or programming with variable pulse trains as shown in FIGS. 8A and 8B.

Figure 6:
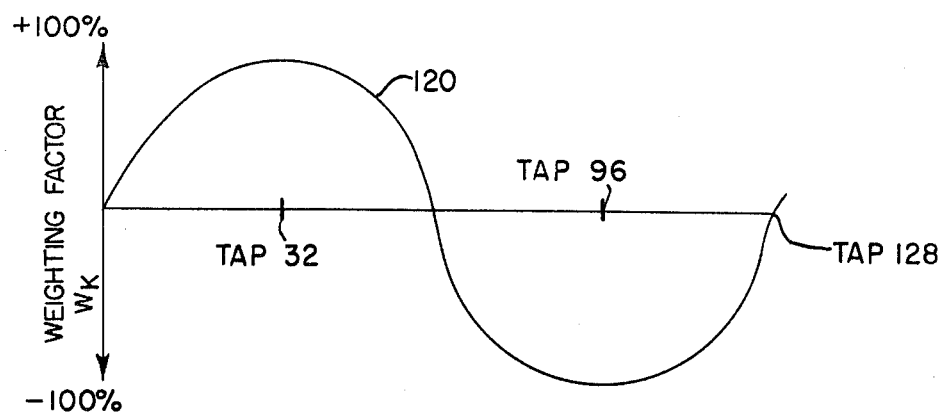
FIGS. 6 and 7 show, respectively, in graphic form a sinusoidal curve representative of the desired weighting factors to be programmed into the MNOS devices as shown in FIG. 1 and the output of the system of FIG. 1 to be compared with the desired weighting factors, whereby a corrective output may be derived.

One of the significant advantages of this invention results from the ability to program the MNOS transistors 22 to provide system outputs in accordance with a variety of processing functions such as Doppler filtering, discrete Fourier transform, post-detection integration, and various correlation functions including linear FM and biphase coded pulse modulation. In an illustrative embodiment of this invention, the MNOS transistors 22 are programmed in accordance with a sinuosidal curve as shown in FIG. 6, whereby the DASP system of FIG. 1 operates as a transversal filter to provide an output indicative of receiving an input signal of desired frequency. As shown in FIG. 6 a weighting factor varying between +100% and −100% is set into the MNOS transistors 22 in accordance with their tap position along the length of the CCD 10. For example, at tap 32 of the 128-tap CCD 10, $W_{32}$ is set at +100%, whereas at tap 96, $W_{96}$ is set at −100%. As explained above, two MNOS transistors 22 are provided for each electrode 100 or tap position, whereby negative and positive weighting factors may be applied to the output derived from each tap. Thus, at tap position 32, MNOS transistor 22-32a is set to its lowest threshold value in the order of 2V, and at tap position 96, MNOS transistor 22-96a is set to a high threshold value approaching 10V. Further, at tap 96, the MNOS transistor 22-96b is programmed to have a weighting factor of −100%, i.e., it is set to a threshold voltage of 2V. As indicated in FIG. 1, the MNOS transistors having a suffix a are programmed to provide negative weighting factors and are connected to the negative summing bar 24b, whereas those transistors 22 with suffixes b are programmed to have positive weighting factors and are connected to the positive summing bar 24a to be subtracted by the analog reconstruction circuit 32 from the signals applied to the summing bar 24b.

In order to program the MNOS transistors 22 as incorporated into the DASP system of FIG. 1, the programmed weighting constants as stored in a program weight storage 36, illustratively taking the form of a PMOS silicon gate ROM as manufactured by Signetics, Inc. under the model designation No. 2580, are read out sequentially to set the threshold value $V_{TH}$ of the MOS transistors 22 during the WRITE mode. Initially, each of the MNOS transistors 22 may be cleared, thereby being set to its low threshold state. As the weighting factors are read out sequentially from the storage 36, they are applied to a comparator circuit 34 whose output is indicative of the difference between the reference value of the weighting factor derived from the storage 36 and the measured value thereof derived from the analog reconstruction circuit 32. The comparator output is applied to the read control circuit 38, which serves to actuate a switch 44, whereby the output of a programming pulse generator 48 is applied along write bus 26 to the gate of each of the MNOS transistors 22 in sequence. Further, the output of the comparator 34 is also applied to the programming pulse generator 48, whereby the amplitude (or duration) of the pulse applied to the gate of the MNOS transistor to be programmed is controlled in accordance with the weighting factor stored in the storage 36. In order to synchronize the read-out of the weight factors from the storage 36 in accordance with the writing of the selected MNOS transistor 22, the program weight read control circuit 38 actuates a timing pulse generator 42 to generate a single output pulse, during the PROGRAM mode of operation, to be applied to a static control register 30, illustratively taking the form of an 8-bit parallel output shift register as manufactured by Signetics, Inc. or Texas Instruments under the designation No. 74164, and also to a clock circuit 46 for generating and applying $\phi_1$ and $\phi_2$ clock signals to the register 30, whereby the single pulse is sequentially shifted from one stage to the next in synchronism with the programming of the individual weighting factors $W_k$ according to the data stored in the storage 36. As indicated in FIG. 1, the program weight read control circuit 38 and the CCD master clock circuit 11 are interconnected to ensure synchronism in their operations. The output taps of the static register 30 are connected as shown in FIG. 1 to corresponding switches generally indicated by the numeral 28, whose suffix corresponds to that of the MNOS transistor 22 connected thereto. For example, switch 28-2a actuated in response to the output of stage 30-1 of the register 30, controls the input as applied along write line 26 to the gate of transistor 22-2a. Thus, as the synchronizing pulse, as derived from the timing pulse generator 42, is transferred to the first stage 30-1, its output actuates switch 22-2a to pass the write pulse or train of pulses (as shown in FIGS. 8A and 8B) to the gate of the MNOS transistor 22-2a to write a weighting factor in accordance with that derived from the first storage position of the storage 36.

In similar manner, the program weight read control circuit 38 initiates the operation of a test pulse generator 51 to apply a calibration test pulse through the stabilized charge injector 12 into the CCD 10 to be shifted from stage (or well) to stage under the influence of the four-phase clock inputs. The four-phase clock inputs serve to shift the test pulse from stage to stage, whereby a known output is derived sequentially from the terminals 100 in synchronism with the calibration test pulse propagating along the CCD 10 while the READ voltage as derived from the generator 49 and the switches 44 and 28 is applied to the gates of all MNOS memory devices 22. Thus, a single test pulse is shifted through the stages of the CCD 10 so that an appropriate voltage is developed at the node $V_L$ (as shown in FIG. 2) and is applied to the drain of the corresponding MNOS transistor 22 at the same time that a READ pulse of the appropriate amplitude is applied to the gate electrode of that MNOS transistor 22, whereby its conductance is set in accordance with the coded weighting factor.

As mentioned above, one of the requirements for DASP is an accurate analog multiplier such as provided by the electrically reprogrammable i.e. electrically alterable, non-volatile MNOS transistors 22. One problem is achieving an accurate setting of the MNOS conductances results from random variations of either the CCD register tap gains or that the reference signal conductance matrix produces side lobes in the filter bank. These errors add generally in a non-coherent manner and the effect of individual error is reduced by the correlation gain of the conductance matrix of the MNOS transistors. For example, if the rms gain variation of individual conductances is 3%, and the correlation gain is 20dB, then the average filter side lobes (for filters far away from the signal frequency) will be 50dB down. However, for certain combinations of signal frequencies and filters, the individual errors may add nearly coherently, in which case the peak side lobe will lie only about 30dB down. However, a 3% rms overall accuracy appears to be difficult to achieve using a weighting or conductance setting operation on an open loop basis. Therefore, as will now be explained, a reiterative procedure is used to electrically set the weighting factors, e.g. adjusting the threshold value or conductance of the corresponding MNOS transistors 22. In general, each of the MNOS transistors 22 is set to a nominal conductance value by setting its threshold voltage, as explained above, and thereafter adjusting to the desired value using either a single correction pulse or burst of pulses as derived from the programming pulse generator 48 under the control of a difference or correction signal derived from the comparator 34 indicative of the difference between the measured output of the DASP system as derived from the analog reconstruction circuit 32 and a reference value as derived from the program weight storage 36.

Figure 7:
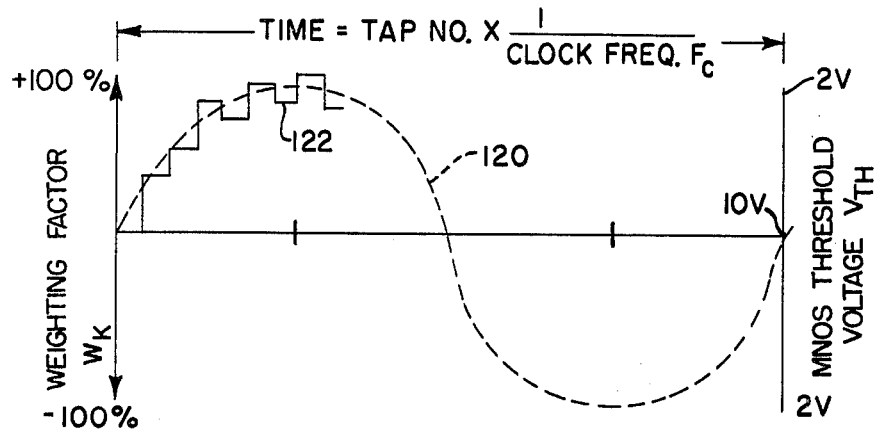

With reference to FIG. 1, a reiterative programming mode of operation is conducted after the initial setting of the weighting factors into the MNOS transistors 22 under the control of the program DASP read control circuitry 38 which actuates the timing pulse generator 42 to generate a series of "one" signals filling register 30 with command signals to close all switches 28 and switch 44 to connect READ voltage 49 to bus 26, and the test pulse generator 51 to apply a single test pulse to the CCD 10 to be advanced from stage to stage along the length thereof. As a result, all of the MNOS transistors 22 are simultaneously actuated and the test pulse is applied sequentially to each of MNOS transistors 22 to read out a signal dependent upon the previously-set threshold voltage, which output is applied to the positive and negative summing bars 24a and 24b to provide a series of output signals from the analog reconstruction circuit 32 indicative of the conductance of each of the serially sampled MNOS multiplying transistors 22. In turn, the output of the analog reconstruction circuit 32 is applied to the comparator 34 which provides an output indicative of the difference of the desired weighting factor as stored in the program weight storage 36 and the measured or sensed value of conductance as previously set in the selected MNOS transistor 22. FIG. 7 shows a curve 120 (dotted line) indicating the desired value of the weighting factor as a function of the tap position of the CCD 10, and also the value of the weighting factor as read out from the analog reconstruction circuit 32, in the form of the curve marked with the numeral 122. The difference between the curves 120 and 122 at each tap position, corresponding to a selected pair of MNOS transistors 22a and b, is derived from the comparator 34. The comparator output is applied to the program read control circuit 38 and to the programming pulse generator 48. The generator 48 responds to the difference signal to generate a pulse or series of pulses (see FIG. 8A and 8B) to effect either an increase or a decrease of the threshold voltage. The switch 44 is shifted under the control of the circuit 38 to apply the generator output along the bar 26 to the selected one MNOS transistor 22 (as determined by its actuated switch 28) to adjust its threshold voltage $V_{TH}$ in accordance with the error or difference signal derived from the comparator 34. This process is repeated a number of times until the weighting factor as set into each of the MNOS transistors 22 is within an acceptable tolerance, e.g. 1% of the reference weighting factor stored in the program weight storage 36.

As mentioned above, one of the requirements for DASP is that the analog delay line has a linearity of approximately 1% in signal injection. Signal injection, is explained with respect to FIG. 3 and FIGS. 4A, 4B, 4C and 4D. In FIG. 3, a crosssection of that portion of the semiconductive substrate 72 shows generally the structure of the CCD 10, whereas FIG. 4A to 4D show the charge distribution within corresponding portions of the silicon substrate layer 72. In FIG. 3, a P+ type source region 76 is formed within the substrate 72 and a source contact 80 is formed through a contact 80 is formed through a window within the silicon dioxide layer 74 and the silicon nitride layer 75 in direct contact with the region 76. Linearity of signal injection is achieved primarily through the use of the additional electrodes 80, 82, 84, 86 and 88 to which the biasing potentials V+, $V_H$ and V− are applied. Generally the voltage signals V+ and V−, as shown in FIGS. 5C and 5D respectively, establish a charge distribution as seen in FIGS. 4A to 4D within the silicon substrate layer 72. In particular, the input signal is applied to either the V+ electrode 82 or the V− electrode 86, for the control of the injection of the charge packets into the first and subsequent wells of the CCD 10. $\phi_{1A}$ and $\phi_{1B}$ electrodes are provided to facilitate the injection of the large amounts of charge needed for the maximum allowable propagating charge packet, $Q_{MAX}$. The injected charge then is transferred successively beneath the $\phi_1$, $\phi_2$, $\phi_3$ and $\phi_4$ electrodes of the successive groups 14 to be transferred along the length of CCD 10. The various signals as applied to the electrodes of the stabilized charge injector 12 as well as the shift portion on the CCD 10 are shown in FIGS. 5A to 5J.

Figure 4A:
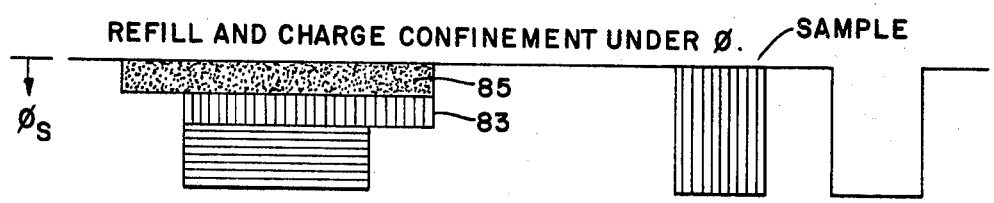
FIGS. 4A, 4B, 4C and 4D are graphic representations of the injection and transfer of charges along the silicon/silicon dioxide interface of the CCD shown in FIG. 3.

The first or refill step of injecting the signal into the code 10 as shown in FIGS. 4A and 5A is effected by pulsing the source electrode 80 negative with respect to the potential of the substrate 72. During the refill phase as shown in FIG. 4A, the charge uncertainty is limited by the following equation:

$$q_n^2 = kT(C_+ + C_H + C_-) \quad (3)$$

Figure 4B:
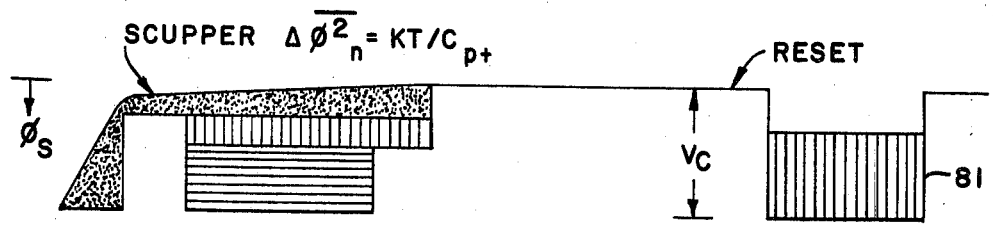

These charge fluctuations are meaningless since in the next step as shown in FIG. 4B, the minority carriers near that charge level are drained or "scuppered" from the upper part 85 of the well established beneath the electrodes 84 and 86 back into the source diffusion region 76, which now is reverse-biased, until the charge level within the well 83 underneath the electrodes 84 and 86 reaches the voltage level as applied to the V+ gate electrode 82. In other words, all of the excess charges including those which give rise to the population variation or randomness as expressed in equation (3), are scuppered into the drain region 78 until the surface potential at the $V_H$ and V− electrodes 84 and 86 equals the surface potential underneath the V+ electrode 82, which has noise fluctuations given by the equation:

$$\overline{\Delta\phi_n^2} = kT/C_{P+} \quad (4)$$

where $C_{p+}$, $C_{p-}$ and $C_{PH}$ equal the total on-chip plus off-chip capacitances at the nodes associated with the V+ electrode 82, the V− electrode 86 and the $V_H$ electrode 84, respectively.

As seen in FIGS. 3 and 5A, the source diffusion 76 is biased by the voltage applied to the electrode 80, whereby all the minority carriers near the charge level as given in the equation (3) within the well formed beneath the electrodes 82, 84 and 86 as shown in FIG. 4B, are drained or scuppered back into the diffusion region 76. At the end of the scupper process, the excess or random charges have been removed from this uppermost part 85 of the well beneath the electrodes 82, 84 and 86.

Figure 4C:
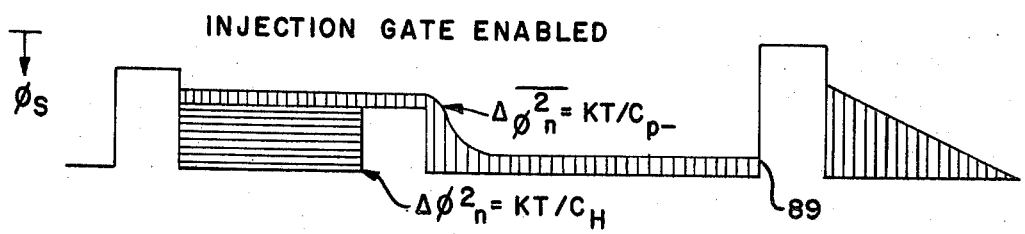

Next, the injection gate is enabled by applying a negative-going inject pulse IG as shown in FIG. 5B to the injection gate electrode 88, whereby positive charges are permitted to flow in the first receiving well 89 as shown in FIG. 4C beneath the IG electrode 88, the $\phi_{1A}$ electrode 90 and $\phi_{1B}$ electrode 91, and $\phi_1$ electrode 92-1. The minority carriers continue to flow until the surface potential beneath the $V_H$ electrode 84 equals the surface potential beneath the V− electrode 86, which has a potential noise fluctuation in accordance with the equation:

$$\overline{\Delta\phi_n^2} = kT/C_{P+} \quad (5)$$

Electrode 84 may be electrically connected to electrode 86 or an independent negative voltage may be applied to electrode 84 to establish a depletion region which acts as a minority carrier holding well 93. During this injection period, any potential fluctuation on the $V_H$ electrode 84 injects undesired charge randomness given by the equation:

$$q_n = C_H \cdot \Delta\phi_n, \text{ where } \overline{\Delta\phi_n^2} = kT/C_{PH} \quad (6)$$

The input signal as shown in FIG. 5D may be applied to either the V+ electrode 82 or the V− electrode 86 whereby the quantity of charges permitted to flow into the well 89 is controlled as shown in FIGS. 4C. Further, equations (4), (5) and (6) as given above may be expressed as follows:

$$Q_{SIG} = (C_H + C_-)(V_+ - V_-) \text{ and} \quad (7)$$

$$q_n^2 = (C_H + C_-)^2 \cdot (kT/C_{P+}) + {}_{(C_H} + c_-)^2 \cdot (kT/C_{P-}) + c_H{}^2 \cdot (kT/C_{PH}) \text{ or} \quad (8)$$

$$q_n^2 = (C_H + C_-)^2 \cdot kT \cdot (C_{P+}^{-1} + C_{P-}^{-1} + C_{PH}^{-1}) \quad (9)$$

The last factor of equation (9) is simply the equivalent series combination of the total off-chip parasitic and on-chip capacitance at the V+ electrode 82, $V_H$ electrode 84 and V− electrode 86, which may be expressed by the term $C_P$, permitting the following approximation:

$$q_n \cong (C_H + C)\cdot(kT/C_P)^{\frac{1}{2}}.$$

In FIG. 3, there is shown $\phi_{1A}$ and $\phi_{1B}$ electrodes 90 and 91 which facilitate the injection of large amounts of charge into the well 89 therebeneath to permit the maximum allowable propagating charge packet, $Q_{MAX}$. As seen in FIGS. 5E and 5F, negative-going pulses are applied to the electrodes 90 and 91 during the injection gate step, whereby a maximum amount of charges is disposed in the well 89. If $V_C$ denotes the surface potential differences generated by the clock signals $\phi_1$ to $\phi_4$ and $V^1$ indicates the surface potential when $Q_{MAX}$ is disposed within the well 89 underneath electrodes 91 and 92, the following relationship is obtained:

$$Q_{MAX} = C_1 \cdot V_C = (C_H + C_-)(V_+ - V_-) = (C_{1A} + V_1) \cdot (V_C - V^1) \quad (11)$$

Figure 4D:
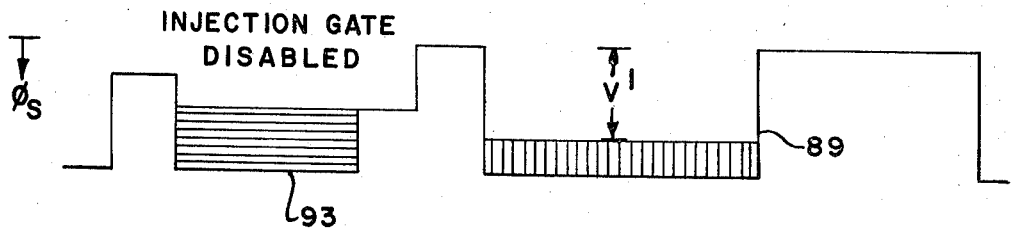

In the final step of operation as shown in FIG. 4D, the injection gate is disabled when the injection gate signal as shown in FIG. 5B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of the charge flow forward into the receiving well 89. To help this forward flow of charges, the effective drain potential $V^1$, must be kept sufficiently below the effective source potential $V-$ to provide the desired longitudinal drift fields from moving the charge forward in accordance with the following equation:

$$(V_+ - V_-) - V^1 > V_{MIN} \qquad (12)$$

From equations (11) and (12), the capacitances are selected and thereby the area of the corresponding electrodes in the formation of the integrated circuit.

From equations (7) and (11), it is seen that the amount of charge injected is linearly related to the input signal voltage $V-$ as shown in FIG. 5D by the factor of the capacitances $(C_H + C_-)$. Since these capacitances are essentially determined by the characteristics of the silicon dioxide layer 74 and the silicon nitride layer 75, they are independent of the charge storage potential applied, giving the desired signal voltage to injected charge linearity to thereby meet one of the requirements for DASP.

After the charge packet has been transferred into the well beneath the $\phi_1$ electrode 92-1 of the first cell 14-1, the charge packet is transferred from well to well along the linear length of the CCD 10 under control of the phase clock signals $\phi_1$, $\phi_2$, $\phi_3$, and $\phi_4$, as shown respectively in FIGS. 5G to 5J. It is understood that the $\phi_1$, $\phi_2$, $\phi_3$ and $\phi_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 5G to 5J as a relatively low amplitude) applied to the next electrode, and thereafter applying to repulsive voltage (shown in the voltage waveforms as a relatively high amplitude) to the well form which the minority charge carriers are attracted. The transfer of the charge carriers from well to well is generally shown in FIGS. 5G to 5J by arrows indicating that the carriers are transferred to the well beneath that electrode to which the corresponding phase clock signal is applied; the charge packet is further transferred from the well underneath the $\phi_4$ electrode of one cell to the well beneath the $\phi_1$ electrode of the next, successive cell 14.

More particularly in the SAMPLE step as shown in FIG. 4A, an attracting voltage is applied to the $\phi_1$ electrode 92, while a repulsive voltage is applied to the $\phi_2$ electrode 94, the $\phi_{1B}$ electrode 91, and the $\phi_4$ electrode 98, whereby the charge packet is confined to a well beneath the $\phi_1$ electrode 92 and an empty well is established beneath the $\phi_3$ electrode 96. Next, in the CHARGE ADVANCE step, the charge packet is moved from the well beneath the $\phi_1$ electrode 92 to a well formed beneath the $\phi_2$ electrode 94 and the $\phi_3$ electrode 96. In particular, negative or attracting pulses are applied to the $\phi_2$ electrode 94 and the $\phi_3$ electrode 96, while repulsive voltages are applied to the remaining electrodes 92 and 98 to deposit the charge packet into an expanded well 81 beneath the electrodes 94 and 96. In the RESET step, as shown in FIGS. 4B, 5G and 5K, the charges are further transferred one step along the length of the CCD 10, and the region beneath the $\phi_2$ electrode 94 is cleared by applying a repulsing voltage to the $\phi_2$ electrode 94, while applying an attractive voltage to the $\phi_3$ electrode 96. Next, in the CLAMP step, as shown in FIGS. 5G and 5K the charges are confined to a well beneath the $\phi_3$ electrode 96 and an empty well is established beneath the $\phi_1$ electrode 92 by applying attracting voltages to the $\phi_1$ electrode 92 and the $\phi_3$ electrode 96, while applying repulsing voltages to the remaining electrodes 94 and 98. In this manner, the charge packets are moved sequentially along the length of the CCD 10 to be sensed as explained above.

In order to ensure the desired linearity and accuracy for DASP, errors in the output signals due to drifting of the biasing sources must be compensated for. As shown in FIG. 2, only every other cell 14 of the CCD 10 is tapped and a bipolar input signal biased to a signal reference level is applied to a multiplexer 199 (see FIG. 1) for sequentially sampling the input signal and applying sampling thereof to the stabilized charge injector 12 and thereafter applying a zero reference voltage of an amplitude corresponding to the zero reference level of the input signal. As indicated in FIG. 1, the multiplexing operations of circuit 199 are coordinated with the propagation of the charge packets along the length of the CCD 10 by the CCD master clock circuit 11. By such multiplexing, any drift in the DC bias may be readily detected and compensated for within the analog reconstruction circuit 32. As explained in detail in U.S. Pat. No. 3,781,574, a process is described by which the reset noise due to any potential fluctuation including nyquist noise, when the well attractive to signal carries is re-established, may be compensated for by detecting a voltage corresponding to that of the reset noise and substracting it from the signal to be read out thereby to eliminate the reset noise error present in the CCD. Thus, during the CLAMP step as explained above, the reset noise voltage is sensed and is stored within the analog reconstruction circuit 32 to be substracted from a subsequent value (for the input signal plus reset noise). In particular, an empty well is shifted beneath the $\phi_1$ electrodes 92 and the corresponding reset error voltage is read out upon the electrode 100 to be processed by the circuit 32.

The output signals as derived from the wells beneath the $\phi_1$ electrodes 92 are read out and multiplied by the weighting factors stored upon the corresponding MNOS FET's 22, and are summed on the positive and negative bus bars 24a and 24b. As seen in FIG. 1, the summed outputs upon the bars 24a and 24b are respectively applied to the analog reconstruction circuit inputs of current-to-voltage amplifier 140 and 142.

The reconstruction circuit inputs as derived from bars 24a and 24b are applied to be summed, sampled and stored thus removing the noise of the CCD's and to readjust the zero reference level of the signal. In particular, the output of the amplifier 140 is applied through resistive element 145 to an operational amplifier 142 having a resistive element 144 connected between its output and input, while the output line 24b is applied to the input of operational amplifier 142, the output of which is coupled to its input through a resistive element 144. The operational amplifiers 140 and 142 serve to sum the outputs applied to the positive and negative bus bars 24a and 24b, whereby the signals applied to the bus bar 24b are substracted from those applied to the bus bar 24a, while maintaining the bus bars 24a and 24b at a predetermined DC voltage. Such an output is applied by a preamplifier stage comprising an operational amplifier 146, to a first or "clamp" capacitor 148 whose output is coupled to the electrically-controlled switch device 152, which may be, for example, a MOS switch. The switch 152 couples the capacitor 148 to a negative reference voltage $-V_C$ which is established upon a potentiometer 154 and which acts as a clamping voltage or DC restore voltage for the capacitor 148. The switch device 152 is adapted to be opened and closed in accordance with a synchronized first clamping signal as depicted in FIG. 5L, applied to its terminal 151. In turn, the common point between capacitor 148 and switch 152 is connected to the high impedance input of an operational amplifier 150, while its other input is connected to the reference voltage. Additionally, the operational amplifier 150 has a feedback network including resistive elements 158 and 156 coupled from the output of the operational amplifier 150 to the second-mentioned input. The output of the operational amplifier 150 is applied to a second electrically-controlled switch 160, which is opened and closed under the control of a first sample signal (see FIG. 5M) applied to its terminal 159; the switch 160 may, for example, comprise a MOS switch device. The switching device 160 is coupled through a second or "sample" capacitor 161 to ground. The point of interconnection between the capacitor 161 and the switch 160 is connected to the high impedance input of an operational amplifier 162, which has a feedback network including the resistive elements 166 and 164.

In turn, the output of the operation amplifier 162 is coupled to a third or "clamp" capacitor 168, which is selectively set to a bias potential established upon a potentiometer 174 by a switch device 172; the switch device 172 may illustratively be a MOS switch and is selectively opened and closed in response to a second reference or clamp signal (see FIG. 5N) applied to its terminal 171. The point of interconnection between the switch 172 and the clamp capacitor 168 is coupled to the high impedance input of the operational amplifier 170; the operational amplifier 170 has a feedback network including the resistive elements 178 and 176. In turn, the output of the operational amplifier 170 is applied to a further switch device 180 to be opened or closed in accordance with a control voltage applied to its input terminal 181. In its closed position, the switch 180 applies the output of the operational amplifier 170 to a capacitor 183 coupled to ground and to the high impedance input of an operational amplifier 182. The operational amplifier 182 includes a feedback circuit including resistive elements 186 and 184. As shown in FIG. 1, the output of the operational amplifier 182 represents the sum of the products of the output of the CCD outputs and the positive weighting factors less the products of the CCD outputs and the negative weighting factors.

As explained above, the multiplexer 199 receives and samples the input signal whereby alternate pulses of the sampled portions of the input signal are interspaced between a reference signal whose level corresponds to the zero reference level of the input signal. Thus, a sampled portion of the input signal and a reference level signal are sequentially moved down from well to well along the length of the CCD 10. Output signals are derived from the electrodes 100 associated with alternate wells beneath the $\phi_1$ electrodes 92 as generally shown in FIG. 1. As indicated in FIGS. 1 and 2, outputs are derived from the electrodes 100-2 and 100-4, whereas no output signals are derived from the well associated with the $\phi_1$ electrodes 92 of the cells 14-1 and 14-3. As a result, at one instant of time, charge packets corresponding to sequentially injected reference level signal pulses (as so identified in FIG. 5K) may be stored in the wells associated with the cells 14-2 and 14-4, to be read out and applied to the summing bars 24a and 24b. At this instant of time, the charge packets corresponding to sequentially inserted sampled portions of the input signal are disposed in the wells associated with the cells 14-1 and 14-3 and are not read out. As the clock signals $\phi_1$ to $\phi_4$ are applied to the CCD 10, the charge packets are shifted so that the charge packets corresponding to the sampled signal (as so indicated in FIG. 5K) are disposed in the cells 14-2 and 14-4 to be read out, while the charge packets corresponding to the pulsed reference signal are disposed in the cells 14-3 and 14-5. In this manner, by taking outputs from alternate cells 14, the sampled portions of the input signal may be read out simultaneously from the even-numbered cells 14 and then transferred to the odd-numbered cells 14, at which time samples of the reference level signal are read out. Further, an output is derived from each of the bus bars 24a and 24b at those times at which an empty well is disposed beneath the $\phi_1$ electrodes 92 of the even-numbered cells 14. The output at this instant is sampled and is subtracted, as will be explained, to remove the effect of reset noise.

The analog reconstruction circuit 32 operates to sample and hold the summed samples of the reference level pulses and those signals derived from the empty well of the CCD 10, to be subtracted from the sampled input signal in the following manner. First, the reset noise signals are derived from the electrodes 100 to be summed by the operational amplifiers 140 and 142 and to be preamplified by the operational amplifier 146 to charge the capacitor 148; during the first step, the switch 152 is closed in response to the first clamp pulse as shown in FIG. 5L, whereby the capacitor 148 is coupled to the biasing voltage $-V_C$. Next, switch 152 is opened, switch 160 is closed and then opened in response to the first sample pulse as shown in FIG. 5M, and switch 172 is closed and then opened in response to the second or reference clamp pulse as seen in FIG. 5N, whereby the summed reference samples of the input signal held in the even-numbered cells 14 are applied to the capacitor 148, whereby that signal indicative of the reset noise is subtracted from the samples of the input signal reference to remove the noise content therefrom; in turn, the resulting difference reference level is applied to the operational amplifier 150 to be stored upon the capacitor 161.

Next, the serially inserted signal samples are shifted to the even-numbered cells 14 and are read out and applied to the analog reconstruction circuit 32. In this step, the switches 152 and 172 (switch 172 is operated in response to the second reference clamp pulse as shown in FIG. 5N), are operated (i.e. closed then opened), whereby the summed outputs corresponding to the true reference samples serve to charge the capacitor 168, the switch 160 is operated, and the switch 180 is operated in response to the pulse as shown in FIG. 5O, such that the capacitor 161 is newly-charged to a level indicative of the summed outputs corresponding to the gross signal samples, from which is subtracted the true reference level as stored on capacitor 168 to give the true signal equal to the difference between the gross signal sample and the reference sample. While an empty well is shifted beneath the $\phi_1$ electrode 92 of each of the even-numbered cells 14, a signal corresponding to an empty well indicative of the reset noise present in the CCD 10 is read out and is applied to the analog reconstruction circuit 32, wherein the reset error signal is applied to the capacitor 148 to provide a signal indicative of the difference therebetween, i.e. the signal sample with reset noise removed, which then is stored upon the capacitor 161. Thus, as a result of the four steps, a reset error signal is derived and stored, to be subsequently subtracted from the summed portions of the reference level sample. Again, the reset level is sampled and stored to be subtracted from the signal sample. Finally, the zero reference level signal, free of reset noise, is then subtracted from the signal sample, free of the reset noise, to provide an output of the circuit 32 and the system of FIG. 1, that is adjusted for DC system drifts and free of reset readout noise. The first clamp, first sample, second or reference clamp and true signal sample pulses as seen in FIGS. 5L to 5O, respectively, are readily provided by the CCD master clock circuit 11, as shown in FIG. 1.

Thus, to the greatest degree possible, all input signals pass through the same elements and the corresponding signal samples and zero-reference level samples pass through identical on-chip paths. Thus, the DC biased errors are compensated for by the use of the zero signal reference level sample, while the empty wells are sampled to remove reset noise from the summed samples. Further, the DC biased errors typically vary at a slow rate, such that the zero signal reference need not in one embodiment be interlaced between alternate signal samples, but may be injected only occasionally. Further, since the signal path during the closed loop programming calibration is the same as that for the normal operation, random topographic variations in the device are compensated by the electrical adjustment made to the weighting factors written into the MNOS FET's 22, as explained above.

The CCD 10 and the plurality of MNOS FET's 22 as shown in FIG. 2 are capable of being manufactured into a single integrated circuit by LSI techniques. A description of the layout pattern of such an integrated circuit is set out in detail in the above-identified application Ser. No. 507,115, entitled, "A Programmable Analog Transversal Filter", and the method for manufacturing such an integrated circuit is described in detail in the aforementioned application and in the above-identified application entitled, "The Structure of and the Method of Processing a Semiconductor Matrix of MNOS Elements", both incorporated herein specifically by reference.

In FIG. 9, there is shown a further embodiment of this invention in which a matrix of memory elements in the form of MNOS transistors 22 are formed with a semiconductor assembly 270 in a matrix of $R_1$ to $R_M$ rows and $C_1$ to $C_N$ columns, thus providing M × N memory elements within the matrix. An input signal is applied to a stabilized charge injector 212 of a CCD 210 similar to that described above with respect to FIGS. 1 and 3 and thereafter sequentially shifted from cell to cell 214 along the length thereof, it being understood that cell 214-N is the last cell of the CCD 210. A clock control circuit 216, to be described in detail with respect to FIG. 12, generates the phase or clock signals $\phi_1$ to $\phi_4$ to be applied to each of the cells 214; for the purposes of clarity, the clock signals are shown in FIG. 9 as being applied only to cell 214-1. As the input signal is shifted along the length of the CCD 210, a plurality of outputs is derived from electrodes associated with P+ diffusion regions (not shown in FIG. 9), associated with the $\phi_1$ electrodes of alternate cells 214; as explained above, such an arrangement facilitates a double sampling technique whereby readout noise may be removed and the input signal adjusted with respect to a reference level signal inserted and shifted along the CCD 210. The outputs as derived from the alternate cells are applied to corresponding row input conductors $CI_1$ to $CI_N$ corresponding to the first to the Nth columns of the matrix. Each of the CCD outputs is applied along its corresponding input conductor CI through a corresponding one of the driver amplifiers 274-1 to 274-N of the source follower type shown explicitly in FIG. 2; the output of the driver 274 is applied along its input conductor CI and is coupled to the drain electrode of each of the MNOS memory elements 22 in that column.

In order to program the matrix of MNOS memory elements 22, means is provided for selectively applying PROGRAMMING signals to each of the MNOS transistors 22 and for successively adjusting its threshold voltage $V_{TH}$, for obtaining an output therefrom to be compared with a stored value of the weighting factor to be programmed upon the selected MNOS memory element 22 and for providing signals to increase or decrease the threshold voltage $V_{TH}$ as a function of the difference between the measured weighting factor and the reference, stored value thereof. In particular, a row address circuit 224 is responsive to an input signal indicating the addressed row to be programmed for energizing one of a plurality of row drivers $226_1$ to $226_M$ (see FIG. 10 for detailed schematic) corresponding to the addressed row. The output of the selected row driver 226 is applied through the correspondng one of a plurality of input row conductors $R_1$ to $R_M$ to a corresponding one of the electrodes 294-1 to 294-M associated with the isolated substrate (formed within the semiconductor assembly 270) associated with the MNOS transistors 22 of one row. In particular, a P-type isolation diffusion is carried out upon the semiconductor assembly 270 to form a plurality of moats $272_1$ to $272_M$ associated with each of the rows of the memory matrix, whereby the MNOS transistor 22 of one row are electrically isolated from those of another row. Reference is made to the above-identified application entitled, "A Programmable Analog Transversal Filter" for disclosure of a suitable method by which the assembly 270 is manufactured.

In a similar manner, one of the plurality of columns is selected according to an input signal applied to a column address circuit 250. In accordance with the column address signal, one of the outputs of the column address circuit 250 is provided to actuate a corresponding one of the column drivers 242-1 to 242-N the operation of which will be explained in detail with respect to FIG. 10. The output of the column driver 242 associated with the addressed column applies an output along its corresponding column C to the gate electrodes of the MNOS transistors 22 of the addressed column. Thus, in the programming mode of operation, one row and one column of the matrix of MNOS transistors 22 are selected and appropriate PROGRAMMING signals are applied through the column driver 242 and the row driver 226 of the addressed row and column to one MNOS transistor 22 to set its threshold voltage in accordance with the reference weighting factor, as will be explained in detail later. Further, the voltages as applied to the remaining MNOS transistors 22 are such that their threshold voltages are not shifted. In this manner, appropriate PROGRAMMING signals, either in terms of a single pulse or a train of pulses, are applied to increase or decrease the threshold voltage of the addressed MNOS transistor 22, as explained above.

Output signals are obtained from one or all of the MNOS transistors 22 within a given row and applied to the corresponding output row conductor of a plurality of output row conductors $RO_1$ to $RO_M$. In particular, the output of the MNOS transistor 22 is derived from its source electrode and applied through one of the conductors RO to its corresponding switch of a plurality of switches $290_1$ to $290_M$. A switch 290 is provided for each row output RO for selectively applying the row output to a CCD parallel-to-series converter 220. A reference level voltage $V_{OL}$ is applied through impedance elements $292_1$ to $292_M$, corresponding to each of the row output conductors RO. In one illustrative embodiment of this invention, the parallel-to-series converter 220 may take the form of that device as described in an article entitled, "Characterization of Surface Channel CCD Image Arrays at Low Light Levels", by White, Lampe, Blaha and Mack, appearing in the *Journal of Semiconductor Circuits* of January/February, 1974, or in U.S. Pat. No. 3,781,574. After the output signals have been applied to the parallel inputs of the converter 220, the switches $290_1$ to $290_M$ are rendered non-conductive and the output signals as stored in the corresponding wells or stages of the converter 220 are shifted out in serial fashion through an output circuit 221 to provide the DASP system output.

Figure 10:
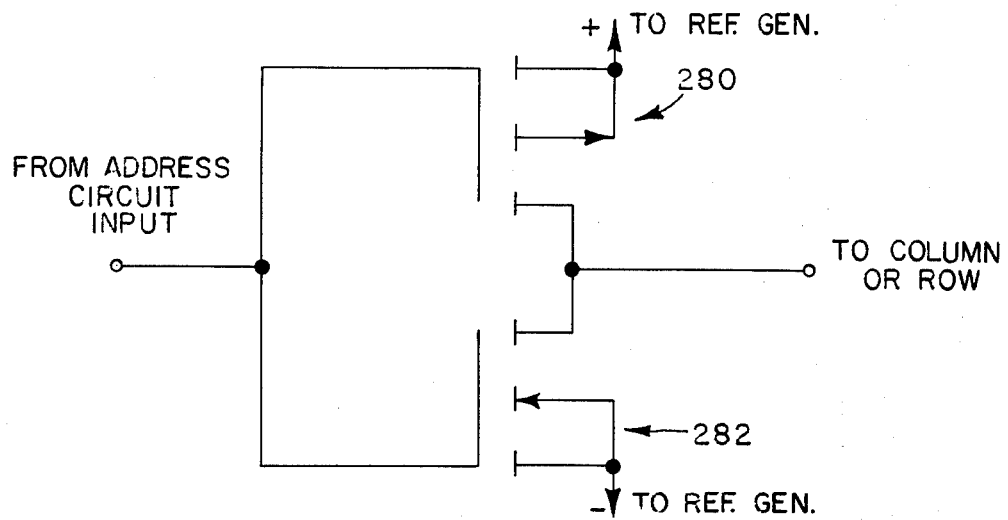
FIG. 10 is a schematic drawing of a driver circuit incorporated into the DASP system of FIG. 9.

The row address circuit 224 and the column address circuit 250 respond to row and column address signals to select which column and row to which the PROGRAMMING signals are to be applied to set the threshold voltage of the selected MNOS memory element 22 in accordance with its reference weighting factor. The outputs of the row and column address circuits 224 and 250 energize the row or column driver in a manner as will be more specifically explained with respect to FIG. 10. FIG. 10 shows an illustrative embodiment of the row and driver circuits 226 and 242. In particular, the address circuit output is applied to the substrate of each of a pair of transistors 280 and 282 of opposite type. Control inputs are provided from first and second reference generators to the base and emitter of the corresponding transistors. The driver output is derived from the corresponding collector of the transistor to be applied to the corresponding row or column conductor. In operation, the output of the address circuit serves to choose which generator is to be applied to the column or row conductor. For example, if the address circuit output is low indicating that the corresponding column or row is non-selected, the reference generator applied to the transistor 282 controls the output as derived from the driver circuit. On the other hand, if the output of the address circuit goes high indicating that the corresponding column or row was selected, the reference generator applied to the transistor 280 controls the output to apply signals whereby the selected MNOS memory element is written upon, as will be explained in greater detail.

With reference to FIG. 9, each of the row drivers $226_1$ to $226_M$ receives inputs from first and second reference generators 228 and 230 along the conductive buses 231 and 233, respectively. Thus, the row driver 226 corresponding to the addressed row is actuated whereby its output is under the control of the reference generator 228; the remaining row drivers 226 are disposed under the control of the reference generator 230. In this manner, a writing voltage as controlled by the reference generator 228 is applied through the electrode 294 to the substrate of the MNOS transistors 22 of the selected row, whereas suitable potentials under the control of the reference generator 230 are applied to the substrates of the MNOS transistors 22 of the remaining rows, whereby the threshold voltages of the non-selected MNOS transistors 22 are not affected.

In a similar manner, input signals are applied to each of the column drivers $242_1$ to $242_N$ from each of the reference generators 234 and 236 along their corresponding conductive bars 238 and 240. In particular, the output of the actuated or selected column driver 242 of the addressed column is actuated by the column address circuit 250, whereby its output is placed under the control of the reference generator 234, whereas the column drivers associated with the non-selected columns are placed under the control of the reference generator 236.

Figure 11:
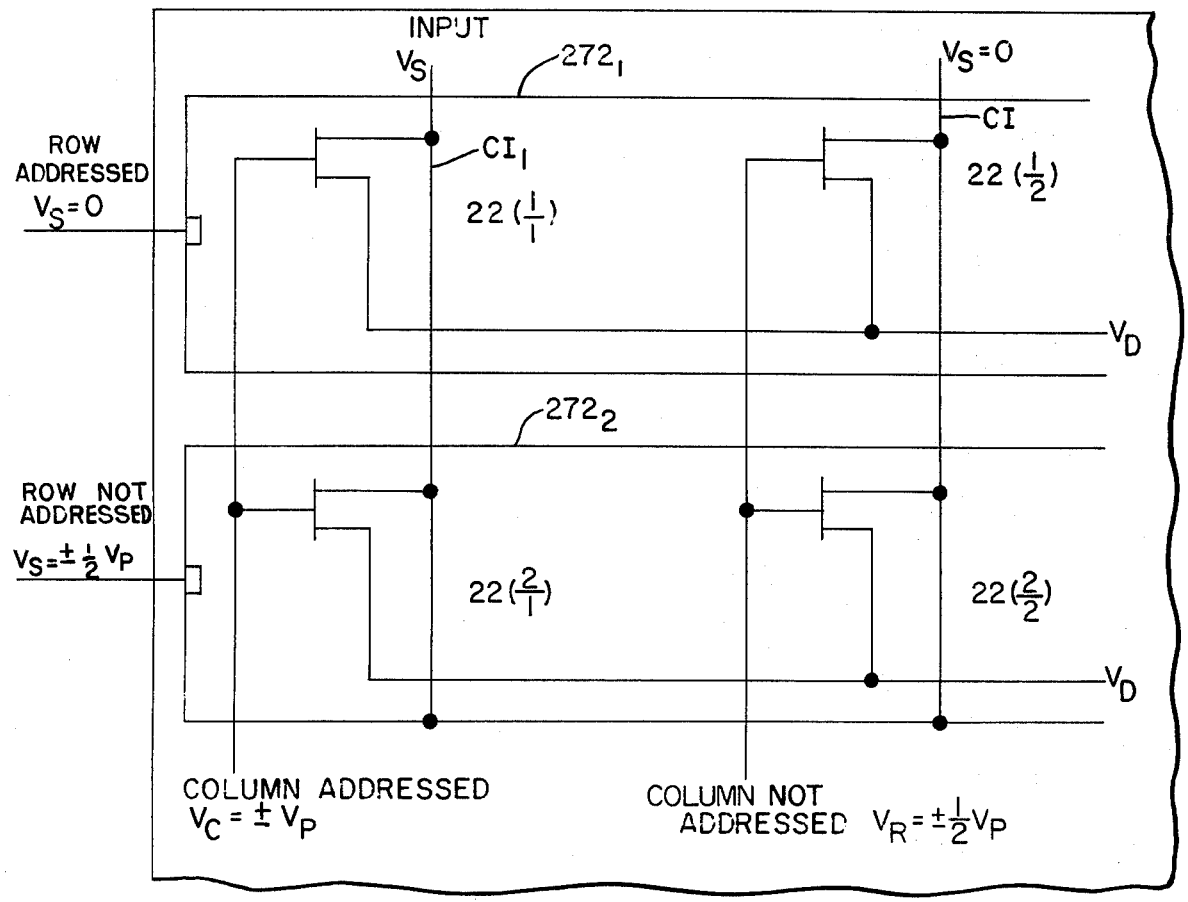
FIG. 11 is an enlarged view of the matrix of MNOS elements particularly illustrating the manner in which a weighting factor is written upon an addressed memory element thereof.

The operation of the matrix of MNOS memory elements 22 in their three modes, ERASE or CLEAR, WRITE and READ, will not be explained in detail with respect to FIGS. 9 and 11. In the CLEAR mode, each of the MNOS memory elements 22 is set to its low threshold value or to a nominal threshold value in preparation to be written upon, i.e. storing therein the weighting factor. Illustratively, a negative voltage is established from the substrate to the gate of the MNOS transistors 22 by energizing each of the row drivers 226 and each of the column drivers 242 to respectively apply a $-V_P$ voltage to the moat 272 of each row, and the column drivers 242 to apply a zero voltage to the gate electrodes of each of the MNOS transistors 22.

In the PROGRAM or WRITE mode, a voltage of sufficient amplitude and/or pulse duration is applied from the gate to the substrate, whereby either an increase or a decrease of the threhold voltage $V_{TH}$ is effected. Initially, the row and column address circuits 224 and 250 select the corresponding row and column, whereby a single MNOS transistor 22 is addressed. For example, as seen in FIG. 11, column 1 and row 1 are addressed, whereby MNOS transistor 22 (1/1) is the selected or address memory element to be programmed. In particular, in the WRITE mode, the voltage $V_S$ applied to the substrate of the selected row is set illustratively to zero; in the embodiment illustrated in FIGS. 9 and 11, the row driver $226_1$ is actuated by the row address circuit 224, whereby the reference generator 228 applies a zero potential through the row driver $226_1$ and the contact 294, to the common substrate $272_1$ of row 1. In a similar manner, the column address circuit 250 actuates the column driver 242-1, whereby the reference generator 234 applies either a $+V_P$ signal to the gate of memory element 22 (1/1). In order to increase the threshold value of the address MNOS transistor 22, the reference generator 234 is controlled to generate a $+V_P$ signal, whereas if it is desired to reduce the threshold voltage, the reference generator 234 provides a $-V_P$ signal to be applied to the gate of the addressed MNOS transistor 22 (1/1). As will be explained, the reference generators 228 and 234 are controlled in accordance with an error signal indicative of the difference between a stored value of the weighting factor and a measured value thereof, whereby the amplitude and/or the duty ratio of the pulses generated thereby are controlled.

It is desired that the threshold voltages of the non-selected MNOS transistors 22 (2/1), 22 (1/2) and 22 (2/2), as shown in FIG. 11, are not shifted at the time that the addressed MNOS transistor 22 (1/1) is being written upon. In particular, the MNOS transistor 22 (2/2) disposed in a non-selected row and column has a voltage of 1/2 $V_P$ applied to its substrate, while a voltage of 1/2 $V_P$ is applied to its gate, i.e. a zero voltage is disposed from the substrate to gate with the result that no shift of the threshold voltage takes place. The MNOS memory elements 22 (2/1) and 22 (1/2) are disposed so that one of their rows or columns is addressed but the other is not. For example, a voltage of 1/2 $V_P$ is applied to their substrate, while a voltage of $V_P$ is applied to the gate of the MNOS transistor 22 (1/2), whereby a voltage of 1/2 $V_P$ is established across its substrate to gate. The typical value of 1/2 $V_P$ is selected in the order of −10V, whereby the threshold voltage of the MNOS transistor 22 will not be affected.

In order to program the MNOS transistors 22, it is necessary to sequentially scan each of the MNOS transistors 22 within the matrix and to successively write the programmed weighting factor upon the addressed transistor 22. As shown in FIG. 9, the row and column address circuits 224 and 250 receive the respective address signals from counters 258 and 260. Counter 258 is advanced one count upon receiving an indication, as will be explained, that the threshold voltage of the addressed MNOS transistor 22 has been set and verified against a value of the weighting factor as stored in a program weight storage 254. Upon writing the correct value of the weighting factor onto the MNOS element 22, an advance signal is applied to the counter 258 from the comparator 252. The output of the counter 258 indicating the count thereon is applied to the column address circuit 250, as an address signal indicating which MNOS transistor 22 within a column is to be addressed. The counter 258 has a limit corresponding to the number "N" of MNOS transistors 22 within a single row. Upon counting to its limit, the counter 258 is reset to zero and further generates a count advance pulse to be applied to the counter 260. The counter 260 provides the row address signal to be applied to the row address circuit 224, which in turn actuates the row drivers 226 of the addressed row. Thus the first row is initially addressed and the weighting factors sequentially set into its MNOS transistors 22 as the counter 258 continues to count. Upon completion of the programming of the first row, the counter 258 reaches its maximum count, is reset and provides an advance signal to the counter 260, whereby the row address circuit 224 is advanced one row and the next row driver 226 actuated. In this manner, each memory MNOS transistor 22 is written upon in a row-by-row fashion.

In a manner similar to that described above, the output of each MNOS memory element 22 is derived and compared by the comparator 252 with the reference value as stored in the program weight storage 254. The comparator 252 provides an error signal to a progressing circuit in the form of a ROM 256 for adjusting, i.e. to the increase or decrease, the threshold voltage of the MNOS transistors 22 being programmed. In particular, the ROM 256 provides a digital output as upon a series of conductors generally shown by the numeral 257 indicating the desired change of polarity, amplitude and/or duty cycle to effect the desired level of decrease or increase of the MNOS device threshold voltage; the ROM 256 is programmed to provide digital output signals in accordance with the input error signal derived from the comparator 252. The digital outputs are applied along the conduit 257 to each of the reference generators 228, 230, 234 and 236 to control their polarity, amplitude and/or duty cycle to provide the desired adjustment of the threshold voltage.

In FIG. 9, a switch 286 supplies upon command from the clock control circuit 216 a pulse signal to be applied to the stabilized charge injector 212 and thereafter to be shifted in accordance with the $\phi_1$ to $\phi_4$ clock signals from cell to cell 214, whereby a suitable biased voltage in the range of −5V to −15V is applied to the corresponding column conductor CI. It is understood that the column address circuit 250 actuates sequentially the column drivers 242 in synchronism with the shifting of the injected pulse along the cells 214 of the CCD 210. The clock control circuit 216 also applies via bus 291 a control or enable signal to close the switches $290_1$ to $290_M$, whereby the output of the addressed transistor 22 being programmed is supplied through the CCD parallel-to-series converter 220 and the output circuit 221 to provide an output indicative of the sensed weighting factor as programmed in the addressed MNOS transistor 22, to the comparator circuit 252. In turn, the comparator circuit 252 provides an output signal whose analog amplitude is indicative of the error between the programmed weighting factor written upon the addressed MNOS transistor 22 and the reference weighting factor stored in the program weight storage 254. In programming, the addressed MNOS transistor 22 is successively programmed and thereafter the stored weighting factor is read out to be compared by the comparator 252 with a reference value of the weighting factor as derived from the program weight storage 254. The output of the comparator 252 is applied to the ROM 256 whose output is applied to the generators 228, 230, 234 and 236, whereby the writing of the weighting factor upon the addressed MNOS transistor 22 is controlled. When the weighting factor has been written upon the addressed MNOS transistor 22 to within an acceptable error, an output derived from the comparator 252 is applied to the counter 258, which responds, as will be explained in detail later, thereto to effect shift of the charge packet corresponding to the injected pulse from one cell to the next succeeding cell 214, whereby the next MNOS transistor 22 is effectively addressed and then programmed. As seen in FIG. 9, outputs from the row and column counters 260 and 258 are also applied to the program weight storage 254, whereby the next weighting factor to be programmed is read out and applied to the comparator 252.

The matrix of memory elements 22 is programmed in accordance with a conductance or weighting factor pattern, whereby each row of the memory elements 22 is set in accordance with a preselected waveform such as a weighted sine wave, a phase coded signal, or any arbitrary waveform. The output of each row is represented by equation (1), as given above, whereby the conductance matrix is able to represent, for example, a weighted discrete Fourier transformer. In the processing operation, an input signal is sampled and injected by switch 287 in response to a clock signal generated by clock control circuit 216, into the stabilized charge injector 212 and is shifted from well to well 214 under the command of the phase signals $\phi_1$ to $\phi_4$ derived from the clock pulse generator 216.

Figure 1B:
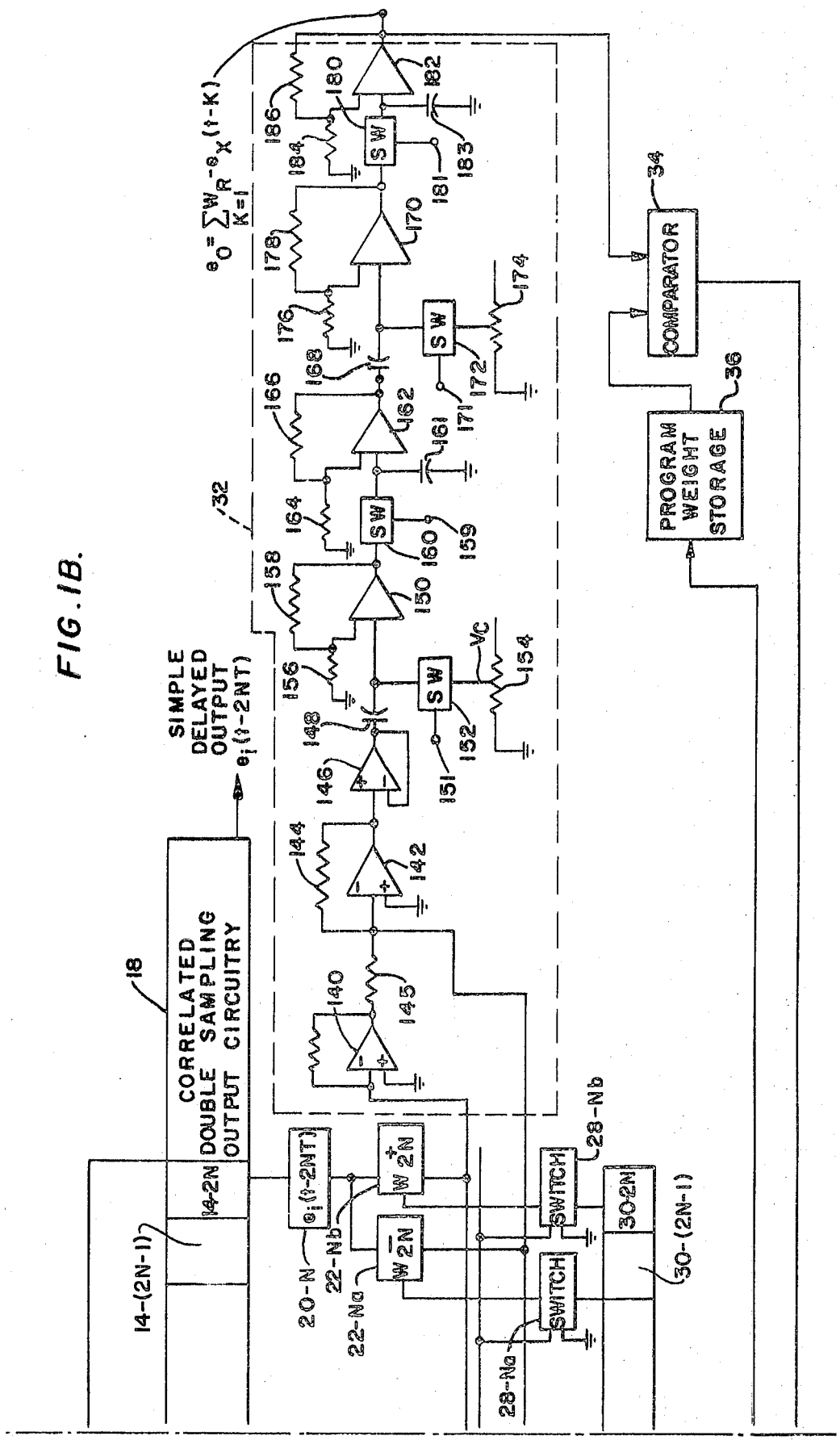

As explained above with respect to FIGS. 1A and 1B, a reference level signal corresponding to the DC bias level of the input signal is also injected into the injector 212 and shifted from well to well of the CCD 210, whereby samples of both the input and reference level signals are derived from its outputs, as shown in FIG. 9, to be processed in a manner similar to that described above with respect to the reconstruction processing circuit 32 of FIG. 1. In this manner, read-out noises may be effectively cancelled. In particular, the reference level signal is applied by switch 289 which closes in response to a command signal derived from the clock control circuit 216.

In the processing or READ mode of operation, suitable read potentials are applied to the row moats 272 and also to the columns C, whereby suitable read biasing voltages are set upon each of the MNOS memory elements 22 of the matrix. The samples of the alternately spaced input and reference signals are shifted along the length of the CCD 210 to provide outputs from the alternate cells 214 to be applied by the corresponding column input conductors $CI_1$ to $CI_N$ to the drains of each of the MNOS transistors 22. In a manner similar to that explained above, the output of each MNOS memory element is the product of the CCD output signal from the corresponding cell 214 and the weighting factor as previously programmed. When the samples of the input and reference level signals have been fully loaded into the CCD 210, the clock pulse generator 216 provides an enable signal to render conductive the switches $290_1$ to $290_M$, whereby the convolution output $e_o$ (see equation 1) for each row is applied to and stored in the corrresponding cell of the CCD parallel-to-series converter 220. Thereafter, the enable signal is commanded false and the analog date $e_o(t)$ in each cell is serially shifted from the converter 220 through the output circuits 221 to provide a system output signal. In an illustrative mode of operation where M=N=100, the sample of the input signal is shifted into the CCD 210 at a rate of 1MhZ. In such a configuration, a new set of data occurs as each new sample is shifted into the CCD 210 at each 100μsec interval. As the data is shifted from cell to cell 214, an enable signal is generated by the clock control circuit 216 each 100μsec to close the switches 290, thus loading the CCD parallel-to-series converter 220. Thus, the CCD parallel-to-series converter is loaded each 100μsec and the data therein shifted out at a 1mHz rate.

In one illustrative embodiment of this invention, a complex filter may be formed on a single matrix as shown in FIG. 9, by defining alternate shift register locations corresponding to alternate columns C to be real and imaginary, setting appropriate real and imaginary conductance patterns in each row of the matrix and commanding the enable signal only on alternate clock pulses, when the input real and imaginary signals correspond with the real and imaginary locations of the CCD parallel-to-series converter 220. Further, it is understood that one row of the matrix may be programmed with real or positive weighting factors, whereas the second row may be programmed with imaginary or negative weighting factors, and the row output conductors may be summed together in a manner similar to that explained with regard to FIG. 1.

Figure 12:
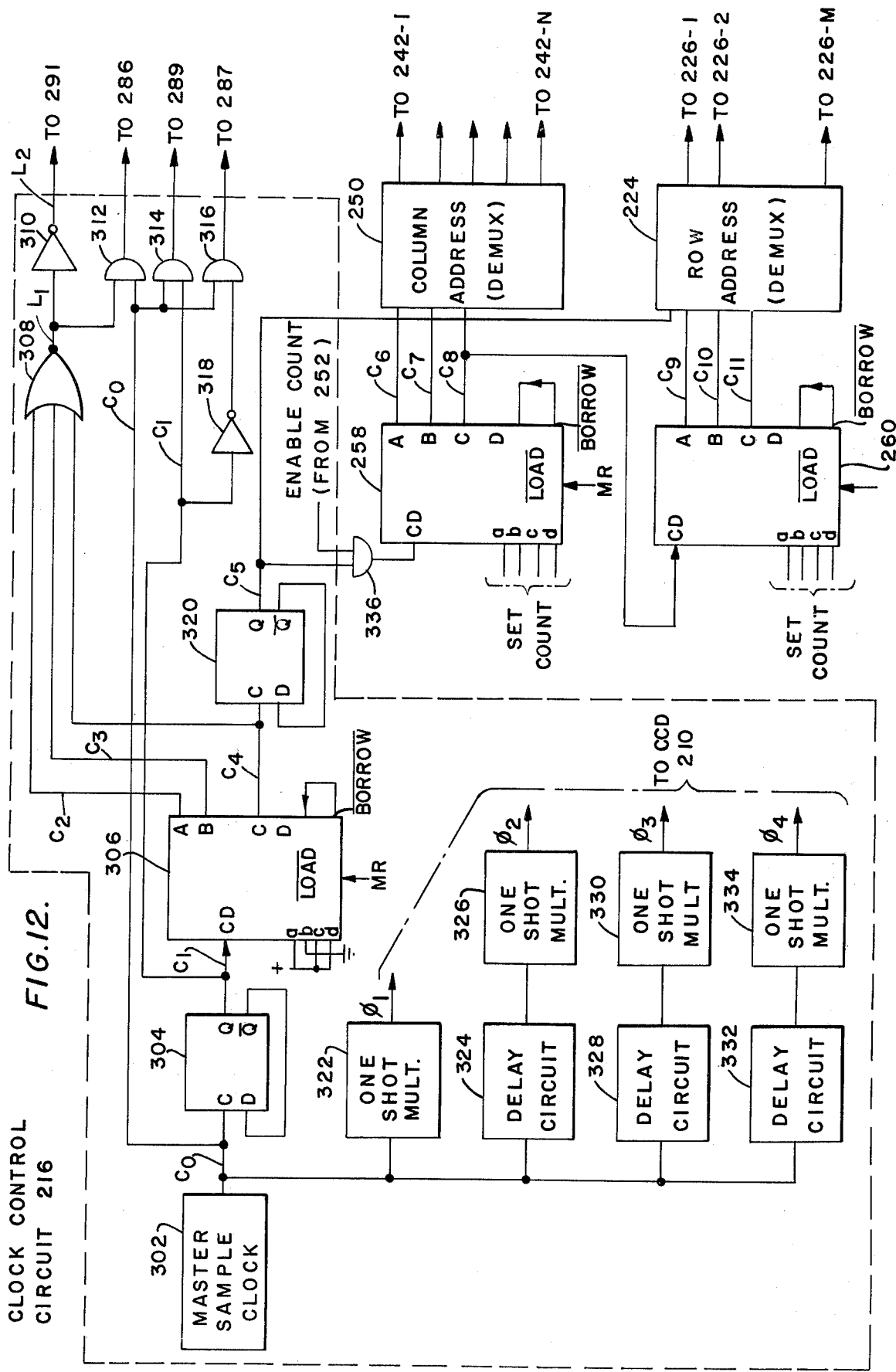
FIG. 12 is a detailed schematic drawing of the circuitry of the clock control circuit generally shown in FIG. 9 and the manner of its interconnection to the column and row counters.
Figure 13A:
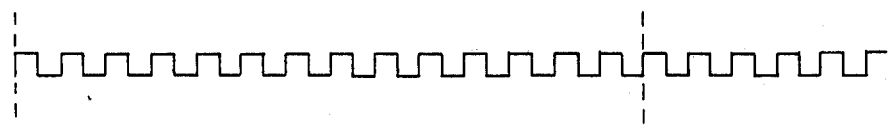
Figure 13B:
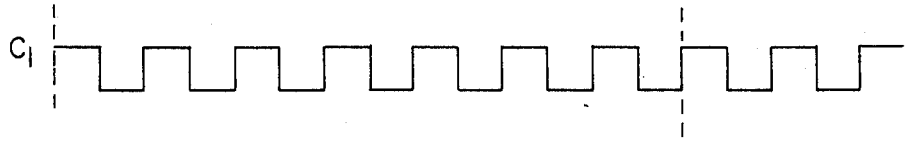
Figure 13C:
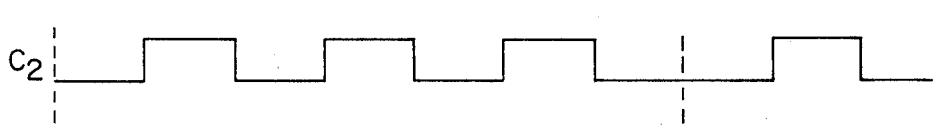
Figure 13D:
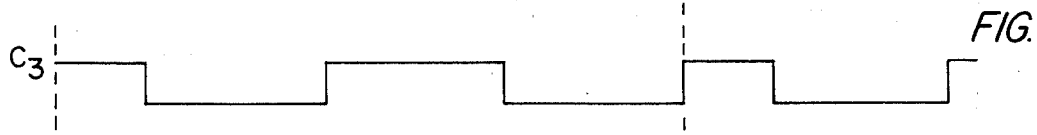
Figure 13E:
Figure 13F:
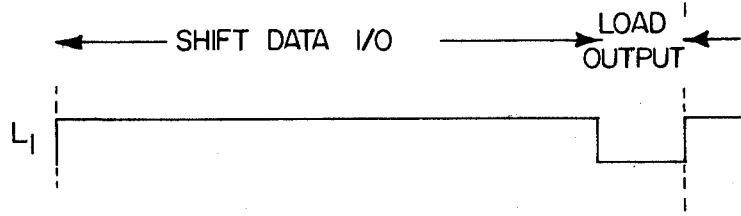

In order to provide a more complete understanding of the operation of the apparatus shown in FIG. 9, the detailed circuitry of the clock control circuit 216 shown in FIG. 12 is described in connection with the waveforms as generated thereby and shown in FIGS. 13A to 13K, 14A to 14G and 15A to 15E. The control clock circuit 216 comprises a master sample clock 302 for generating a clock signal $C_0$ as shown in FIG. 13A, which is applied to the C input of a flip-flop 304 whose output $C_1$ is shown in FIG. 13B. As will be explained, the master sample clock 302 provides the reference clock signal $C_0$ which is used to generate the shifting signals $\phi_1$, $\phi_2$, $\phi_3$ and $\phi_4$ applied to the CCD 210, to develop a series of signals effecting the gating of the input and reference level signals and to actuate selectively the row and column counters 260 and 258, whereby they produce appropriate address signals indicative of the row and column to be read out. As shown in FIG. 12, the master sample clock signal $C_0$ is applied to a one-shot multivibrator 322 whose output forms the $\phi_1$ shifting signal as shown in FIG. 5G. Similarly, the master sample clock signal $C_0$ is applied through a delay circuit 324 to a one-shot multivibrator 326 whose output forms the shifting signal $\phi_2$, through a delay circuit 328 to the one-shot multivibrator 330 whose output forms the $\phi_3$ shifting signal and through a delay circuit 332 to one-shot multivibrator 334 whose output forms the $\phi_4$ shifting signal, as shown respectively in FIGS. 5H to 5J. Significantly, the delay circuits 324, 328 and 332 provide increasing delays, whereby the outputs provided by the one-shot multivibrators 326, 330 and 334 are progressively delayed with respect to the charge advance or shifting signals $\phi_1$, as shown in FIGS. 5G to 5J. As indicated in FIG. 9, the shifting signals $\phi_1$ to $\phi_4$ are applied to the CCD 210. In an illustrative embodiment of this invention, the one-shot multivibrators 322, 326, 330 and 334 may take the form of that manufactured under the designation 74121 by Signetics, Inc.

Further, as seen in FIG. 12, the output of the flip-flop circuit 304 is applied to the CD input of a counter 306, illustratively taking the form of a counter manufactured under the designation No. 74191 by Signetics, Inc. In an illustrative embodiment of this invention, the counter 306 is preset by connecting the inputs a, b, c and d in the configuration shown in FIG. 12, whereby when the counter 306 has down-counted from the preset value to zero, a borrow signal is generated and applied to the load terminal and the counter 306 begins a second countdown from the preset value, e.g. 14. During the counting, a digital output is derived from the counter output terminals A, B and C to provide binary signals C2, C3 and C4 as respectively shown in FIGS. 13C, 13D and 13E. The signals C2, C3 and C4 are applied to a NOR gate 308 which produces an output signal L1 when its inputs are all low. In turn, the NOR output signal L1 is applied through an inverter 310 to provide an output L2 to be applied via bus 291 to the gates of each of the MOS FET switches $290_1$ to $290_m$, whereby the outputs as derived from the MNOS memory devices 22 of the selected row to be read are applied through its MNOS FET switch 290 to the CCD parallel-to-series converter 220. In this manner, the outputs as derived from each of the MNOS memory devices 22 of a single row are read out.

Figure 13G:
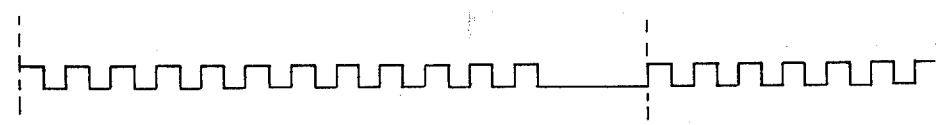
Figure 13H:
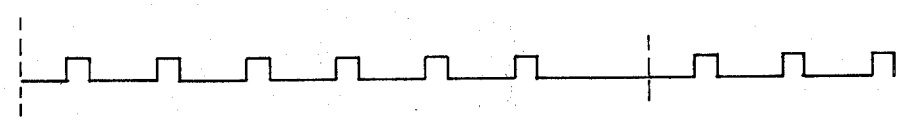
Figure 13J:
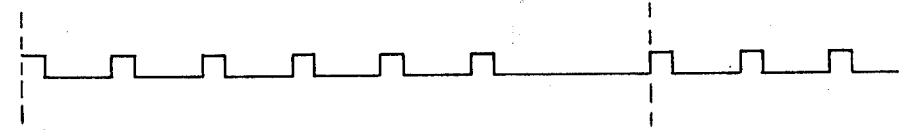
Figure 13K:
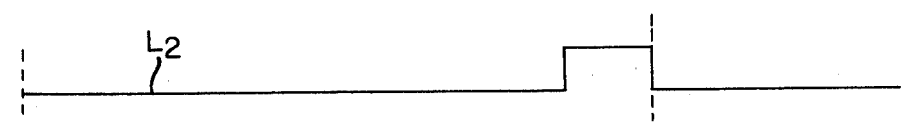

Further, a series of switching signals is developed by the clock control circuit 216 to be applied to the switching circuits 287, 289 and 286, whereby the multiplexing of the input and reference level signals is controlled. In particular, the master clock signal $C_0$ and the signal L1 are applied to AND gate 312 whose output as seen in FIG. 13G is applied to the switch 286, which provides an output in response thereto to be applied to the injection gate 88 (see FIG. 3) of the charge injector 212, whereby either of the input or reference level signals may be injected therein. Similarly, the $C_1$ signal as derived from the flip-flop 304 and the master sample clock signal $C_0$ are applied to an AND gate 314 to provide a control signal as shown in FIG. 13J to be applied to the switch 289. In a similar manner, the sample clock signal and the $C_1$ signal as inverted by an inverter 318 are applied to an AND gate 316 whose output provides a control signal, as shown in FIG. 13H, to the switch 287. Thus, the switches 289 and 287 are respectively actuated to permit the timed application of the input and reference level signals, respectively, into the charge injector 212. As described above with respect to FIG. 1, the injected input and reference level signals are transported down the length of the CCD 210 in response to the signals $\phi_1$, $\phi_2$, $\phi_3$ and $\phi_4$.

In order to sequentially address each of the MNOS memory devices 22 as shown in FIG. 9 in the process of programming a value therein, it is necessary to sequentially address each memory device 22 within a single row and at the end of programming upon each memory device in that addressed row, the next row is addressed. As generally shown in FIG. 9 and more specifically shown in FIG. 12, the column address counter 258 is responsive to a clock signal C5 to count sequentially to a given number corresponding to the number of memory devices within a row, each count addressing a particular column within the selected row of memory devices. The column counter 258 is set so that at the end of counting a predetermined number corresponding to the number of memory devices within a row, it is reset to initiate counting again and further serves to advance the row address counter 260 one increment, whereby the next successive row is addressed. In this manner, each memory device 22 within each row and column is successively addressed so that it may be first programmed and then read out to be compared with a reference value stored within the program weight storage 254, as explained above.

As shown in FIG. 12, the clock signal C4 as derived from the C output of the counter 306 is applied to a flip-flop circuit 320, illustratively taking the form of that manufactured under the designation No. 7474 by Signetics, Inc., to provide an output clock signal C5 to be applied through an enabled AND gate 336 to the CD terminal of the column address counter 258, which may illustratively take the form of that manufactured under the designation No. 74191 by Signetics, Inc. As seen in FIG. 9, the enabling signal is derived from the comparator 252, which functions to compare the written or programmed constant within a single MNOS memory device as derived from the output circuit 221 with that value as stored within the program weight storage 254. If the written and stored or reference values agree within predefined limits, an enabling signal is generated by the comparator 252 and applied to the AND gate 336 to permit the counter 258 to initiate counting. Further, as seen in FIG. 9, each of the counters 258 and 260 provides outputs to be applied to the program weight storage 254 whereby the programmed constant is addressed therein and read out corresponding to the MNOS memory device being programmed at that instant. In an alternative embodiment of this invention, an output from the addressed position of the ROM 256 corresponding to the null zone of comparator 252, may be used to enable the counter 258 as well as to address the program weight storage 254.

In one illustrative embodiment, the column address counter 258 is preset to count down from a value of 6 to zero, at which time a $\overline{\text{borrow}}$ signal as shown in FIG. 14F is applied to its load terminal, whereby the counter 260 is reset to the predetermined number, e.g. 6. As seen in FIG. 12, the A, B and C outputs corresponding to clock signals C6, C7 and C8 as shown respectively in FIGS. 14C, 14D and 14E, are applied to the column address or demultiplexer circuit (DEMUX) 250. In effect, the clock signals C6, C7 and C8 form a binary address for the column address circuit 250 to determine which of the N rows is addressed at any one instant in time. In turn, the column address 250 energizes one of its outputs to apply a corresponding select or enable signal to the corresponding column driver circuit 242, as seen in FIG. 9. FIG. 14G shows which column is so selected.

In turn, the C output of the column address counter 258 is applied to the CD input terminal of the row address counter 260, which may be of the same type as row address counter 258. The row address counter outputs A, B and C provide clock signals C9, C10 and C11 as respectively shown in FIGS. 15A, 15B and 15C. The clock signals C8, C9 and C10 form in binary fashion an address to be applied to the row address or DEMUX circuit 224. In one illustrative embodiment, column and row address circuits 250 and 224 may take the form of that circuit manufactured under the designation No. 74154 by Signetics, Inc. The row address circuit 224 operates to apply an enabling signal to one of its M outputs, e.g. 10, to be applied to the corresponding column driver circuit 226. The configuration as shown in FIG. 12 is illustratively set to generate a binary address corresponding to 10 rows of the MNOS matrix; it is understood that a larger number of rows or columns could be addressed in accordance with the scheme shown in accordance with FIG. 12 by simply adding the required number of counters to supply the necessary address signals to the corresponding address or DEMUX circuits. In one illustrative embodiment of this invention, alternate rows of the matrix 270 of memory devices 22 are programmed with negative and positive coefficients, respectively. To this end, the clock signal C5 may be applied to the row address circuit terminal corresponding to the least significant position of the input address, whereby the row address circuit alternately addresses one row and then the next corresponding to whether a negative or a positive constant is to be stored with the even rows being positive and the odd rows being negative, for example.

The matrix of memory elements 22 described above forms a basic building block by which many different, complex functions may be conducted, including (1) pre-filter, corner-turn memory, (2) filtering, (3) detecting and shaping, (4) function generating, etc., as described in more detail in an article entitled, "CCD's For Discrete Analog Signal Processing (DASP)", by Lampe, White, Mims, Webb and Gilmour, appearing in Westinghouse Electric Corporation Publication, pages 1–9.

In turn, the basic building blocks formed utilizing the matrices described herein by programming such a matrix with a selected waveform according to the desired function, may in turn be used as a building block as a part of an active sonar system, a general-purpose acoustic/sizement mapping/imaging system, SAR signal processor, or target identification processor, as described in the above-noted article.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. A discrete analog signal processing system for processing an input signal in accordance with a pattern of weighting factors, said system comprising:
   a. a matrix of memory elements disposed in rows and columns, each of said memory elements capable of storing an analog weighting factor of the pattern and responsive to a portion of the input signal applied thereto for providing an element output indicative of the product of the stored weighting factor and the input signal portion, said matrix further comprising first sets of row and column conductors coupled to the corresponding memory elements of said matrix;
   b. first converter means comprising a plurality of stages coupled to corresponding column conductors and responsive to the input signal for disposing sequentially a portion of the input signal at each of its stages, whereby a signal portion is applied through its corresponding column conductor to those memory elements of that column;
   c. second converter means comprising a plurality of stages coupled to corresponding row conductors of said matrix, for summing and storing the element outputs of those memory elements of that row and operative to sequentially read out the plurality of summed row signals; and
   d. programming generator means for applying conductance programming signals to each of said memory devices for storing therein a weighting factor in accordance with the pattern of weighting factors.

2. The discrete analog signal processing system as claimed in claim 1, wherein each of said memory elements comprises an MNOS field effect transistor.

3. The discrete analog signal processing system as claimed in claim 2, wherein said plurality of MNOS field effect transistors is formed on a common substrate.

4. The discrete analog signal precessing system as claimed in claim 1, wherein said first converter means comprises a charge-transfer device CTD.

5. The discrete analog signal processing system as claimed in claim 4, wherein said charge-transfer device (CTD) includes a plurality of cells sequentially aligned along the length of said CTD, each of said cells having a plurality of wells formed therein whereby the input signal portions are transferred from cell to cell along the length of said CTD, alternate of said cells along the length of said CTD having output means associated with one of its wells.

6. The discrete analog signal processing system as claimed in claim 5, wherein there is included means for generating selectively reference pulses and multiplex means for generating and applying a series of the signal samples and references level samples to said first converter means with the reference level samples selectively interspersed between the signal portions.

7. The discrete analog signal processing system as claimed in claim 6, wherein the input signals are bipolar with respect to a reference level, and the inserted reference level samples are of an amplitude corresponding to the reference level of the input signals.

8. The discrete analog signal processing system as claimed in claim 6, wherein there is included clock means for generating and applying a plurality of clock signals to corresponding wells of each of said cells of said CTD, whereby the signal samples and the interspersed reference level samples are sequentially moved from cell to cell along the length of said CTD, and processing means for receiving the summed row signals and comprising storage means actuated for storing the reference level samples appearing at said electrodes at a first instant in time and means actuated at a second subsequent instant for differencing the instant input signal samples received and the stored reference level samples.

9. The discrete analog signal processing system as claimed in claim 1, wherein there is included test means for applying a test signal to a selected one of said memory elements, whereby a memory element output is derived indicative of the weighting factor of said selected memory element, and comparator means responsive to the memory element output indicative of the weighting factor programmed on said selected memory element for comparing same with a reference value of the weighting factor for said selected memory element to derive an error signal for adjustably controlling said programming generator means to apply a train of program signals whose duty cycle is adjusted in accordance with the error signal, to said selected memory element, whereby the weighting factor stored therein is adjusted in accordance with the error signal.

10. The discrete analog signal processing system as claimed in claim 9, wherein said programming generator means generates a bipolar write signal, said programming generator means operative in a first mode to increase the level of the stored weighting factor whereby the sum of the bipolar signals is positive, and in a second mode to decrease the value of the weighting factor whereby the sum of the bipolar signals is negative.

11. The discrete analog signal processing system as claimed in claim 1, wherein there is included a first plurality or row driver circuits coupled to apply first programming signals to the memory elements of one row of said matrix and a second plurality of driver circuits coupled to apply second programming signals to the memory elements of one column of said matrix, and row and column address circuits responsive, respectively, to row and column address signals for selectively applying an actuating singal to one of said first and second pluralities of driver circuits, whereby programming signals are applied to the one selected memory element of said matrix, said programming generator means comprising first, second third and fourth generator circuits, each of said row driver circuits of said first plurality coupled to said first and second generators and operative in a first mode in response to the actuating signal derived from said row address circuit for applying the output of said first generator circuit to program weighting factors upon said memory elements and in a second mode to apply the output of said second generator circuit in response to the absence of the actuating signal derived from said row address circuit for applying the output of the second generator circuit to said memory elements of its row whereby the weighting factors stored upon these memory elements remain uneffected, each of said driver circuits of said second plurality operative in a first mode in response to the actuating signal derived from said column address circuit for applying the output of said third generator to said memory elements of its column whereby said memory elements of said selected row and column are applied with programming signals from the first and third generator circuits to effect a programming of a weighting factor thereon and in a second mode in response to the absence of the actating signal from said column address circuit for applying the output of said fourth generator to said memory elements of its column whereby the weighting factors stored upon these memory elements remain uneffected.

12. The discrete analog signal processing system as claimed in claim 10, wherein there is included a read-only-memory (ROM) means programmed for providing digital output signals to control said programming generator means in accordance with the comparator means output.

13. The discrete analog signal processing system as claimed in claim 12, wherein said ROM means is programmed to vary the pulse/duty ratio of the output of said programming generator means in accordance with said comparator means output.

14. A signal processing system for processing an analog input signal, comprising:
a. a plurality of memory elements, each of which is capable of storing an electrically alterable analog weighting factor and responsive to a portion of the input signal applied thereto for providing an element output indicative of the product of the stored weighting factor and the input signal portion, a first output conductor coupled to each of said memory elements for receiving and summing the element output signals applied thereto;
b. first converter means comprising a plurality of stages each coupled to a corresponding memory element, for disposing sequentially portions of the input signal at each of its stages, whereby a signal portion is applied to its corresponding memory element;
c. output means responsive to the summed element signals of said first output conductor, to provide a system output; and
d. means for applying a programming signal to each of said memory elements whereby the analog weighting factor is stored therein.

15. The discrete analog signal processing system as claimed in claim 14, wherein said first converter means comprises a charge-transfer device (CTD) including a signal injector means responsive to the input signal for injecting charges into said charge-transfer device in a substantially linear manner.

16. The discrete analog processing system as claimed in claim 15, wherein there is included output means associated with selected stages of said CTD to provide outputs indicative of the input signal portions of said selected stages, each of said electrode means is coupled to an interconnecting circuit comprising source means for providing a substantially constant current signal through a common node to a field effect transistor having a gate electrode coupled to said electrode means, a drain electrode connected to a bias voltage and a source connected to said common node, said common node coupled to its corresponding memory device.

17. The signal processing system as claimed in claim 14, wherein each of said memory elements comprises an MNOS field effect transistor comprising a drain electrode coupled to a corresponding stage of said first converter means and a source electrode coupled to said output conductor.

18. The signal processing system as claimed in claim 14, wherein said converter means comprises a charge-transfer device for receiving the input signal and applying portions thereoof from stage to stage along the length thereof, selected stages of said charge-transfer device having output means, each of said output means coupled to a drive circuit comprising a source for providing a constant current signal through an interconnecting node to a field effect transistor, said field effect transistor having a gate electrode coupled to said output means, a drain electrode coupled to a biasing voltage and a source electrode coupled to said interconnecting node, said interconnecting node coupled to its corresponding memory element.

19. The signal processing system as claimed in claim 18 wherein each of said memory elements comprises an MNOS field effect transistor having a drain electrode coupled to said interconnecting node, and a source electrode from which an output indicative of the product of the weighting factor stored and the CTD stage output is derived.

20. A discrete analog signal processing system for processing an input signal in accordance with a pattern of weighting factors, said system comprising:
a. a matrix of memory elements disposed in rows and columns, each of said memory elements capable of storing an analog weighting factor of the pattern and responsive to a portion of the input signal applied thereto for providing an element output indicative of the product of the stored weighting factor and the input signal portion, said matrix further comprising first sets of row and column conductors coupled to the corresponding memory elements of said matrix;
b. first converter means comprising a plurality of stages coupled to corresponding column conductors and responsive to the input signal for disposing sequentially a portion of the input signal at each of its stages, whereby a signal portion is applied through its corresponding column conductor to those memory elements of that column;
c. second converter means comprising a plurality of stages coupled to corresponding row conductors of said matrix, for summing and storing the element outputs of those memory elements of that row and operative to sequentially read out the plurality of summed row signals; and
d. a plurality of output switches, each associated with corresponding row conductor and responsive to an enable signal to apply the summed row signals to said second converter means.

21. The discrete analog signal processing system as claimed in claim 20, wherein there is further included clock pulse generator means for generating and applying a plurality of clock signals to said first converter means to effect a shift of the input signal portions along the length thereof and the enable signal to each of said plurality of output switches.

22. A discrete analog signal processing system for processing an input signal in accordance with a pattern of weighting factors, said system comprising:
a. a matrix of memory elements disposed in rows and columns, each of said memory elements capable of storing an analog weighting factor of the pattern and responsive to a portion of the input signal applied thereto for providing an element output indicative of the product of the stored weighting factor and the input signal portion, said matrix further comprising first sets of row and column conductors coupled to the corresponding memory elements of said matrix;

b. first converter means comprising a plurality of stages coupled to corresponding column conductors and responsive to the input signal for disposing sequentially a portion of the input signal at each of its stages, whereby a signal portion is applied through its corresponding column conductor to those memory elements of that column;

c. second converter means comprising a plurality of stages coupled to corresponding row conductors of said matrix, for summing and storing the element outputs of those memory elements of that row and operative to sequentially read out the plurality of summed row signals; and d. summing means coupled to receive the row summed outputs of at least first and second row conductors of said matrix, said memory elements associated with said first row conductor being programmed with a weighting factor of a first type and said memory elements associated with said second row conductor being programmed with weighting factors of a second, different type.

23. The discrete analog signal processing system as claimed in claim 22, wherein said first type of weighting factor comprises negative coefficients and said second type of weighting factor comprises positive coefficients.

24. The discrete analog signal processing system as claimed in claim 22, wherein said first type of weighting factor comprises real coefficients and said second type of weighting factor comprises imaginary coefficients.

* * * * *